(12) United States Patent
Yamazaki et al.

(10) Patent No.: US 7,071,041 B2
(45) Date of Patent: Jul. 4, 2006

(54) METHOD OF MANUFACTURING A SEMICONDUCTOR DEVICE

(75) Inventors: Shunpei Yamazaki, Tokyo (JP); Hisashi Ohtani, Kanagawa (JP); Hideto Ohnuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/761,641

(22) Filed: Jan. 18, 2001

(65) Prior Publication Data

US 2001/0034089 A1    Oct. 25, 2001

(30) Foreign Application Priority Data

Jan. 20, 2000    (JP)    ............................. 2000-012148

(51) Int. Cl.
*H01L 21/84*    (2006.01)

(52) U.S. Cl. ...................................... 438/166; 438/517

(58) Field of Classification Search ........ 438/151–166, 438/517
See application file for complete search history.

(56) References Cited

U.S. PATENT DOCUMENTS

| | | |
|---|---|---|
| 4,727,044 A | 2/1988 | Yamazaki |
| 4,959,700 A | 9/1990 | Yamazaki |
| 5,064,775 A * | 11/1991 | Chang ........................ 438/163 |
| 5,104,818 A * | 4/1992 | Silver ......................... 438/164 |
| 5,132,754 A | 7/1992 | Serikawa et al. |
| 5,142,344 A | 8/1992 | Yamazaki |
| 5,247,190 A | 9/1993 | Friend et al. |
| 5,313,077 A | 5/1994 | Yamazaki |
| 5,315,132 A | 5/1994 | Yamazaki |
| 5,399,502 A | 3/1995 | Friend et al. |
| 5,514,879 A | 5/1996 | Yamazaki |
| 5,543,636 A | 8/1996 | Yamazaki |
| 5,614,732 A | 3/1997 | Yamazaki |
| 5,643,826 A | 7/1997 | Ohtani et al. |
| 5,859,445 A | 1/1999 | Yamazaki |
| 5,904,509 A * | 5/1999 | Zhang et al. ................ 438/154 |

(Continued)

FOREIGN PATENT DOCUMENTS

| | | |
|---|---|---|
| JP | 07-130652 A | 5/1995 |
| JP | 10-092576 A | 4/1998 |
| JP | 10-302707 | 11/1998 |
| WO | 90-13148 | 11/1990 |

OTHER PUBLICATIONS

Wolf et al., "Silicon Processing for the VLSI Era vol. 1: Process Technology", pp. 323-325, 1986, Lattice Press.*
Hermann Schenk et al., Polymers for Light Emitting Diodes, The 19th International Display Research Conference Proceedings, Sep. 6-9, 1999, Berlin, Germany pp. 33-37.

*Primary Examiner*—Richard A. Booth
(74) *Attorney, Agent, or Firm*—Nixon Peabody; Jeffrey L. Costellia

(57) ABSTRACT

There is provided a method of manufacturing a semiconductor device having a TFT with sufficient characteristics and little fluctuation by accurately controlling the addition amount of impurity ions to the semiconductor layer using an ion doping device. A semiconductor device having a TFT showing sufficient and stable characteristics may be obtained by increasing the ratio of the dopant amount in the doping gas and decreasing the ambient atmosphere components (C, N, O) and hydrogen to be simultaneously added with the impurity ions at the time of doping.

42 Claims, 31 Drawing Sheets

U.S. PATENT DOCUMENTS

| | | |
|---|---|---|
| 5,923,962 A | 7/1999 | Ohtani et al. |
| 6,011,277 A | 1/2000 | Yamazaki |
| 6,165,876 A | 12/2000 | Yamazaki et al. |
| 6,258,638 B1 * | 7/2001 | Tanabe et al. .............. 438/163 |
| 6,353,244 B1 | 3/2002 | Yamazaki et al. |
| 6,455,360 B1 * | 9/2002 | Miyasaka ................... 438/149 |

* cited by examiner

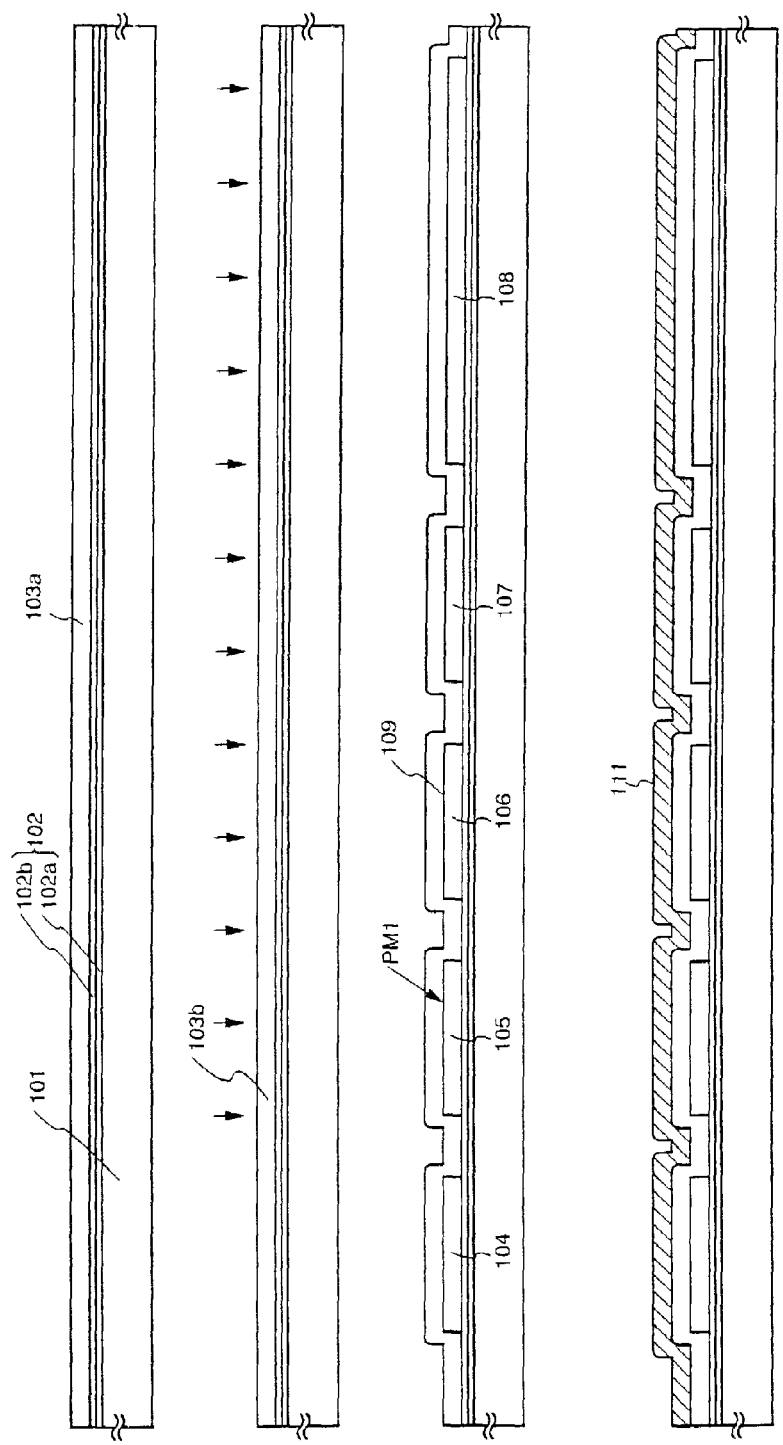

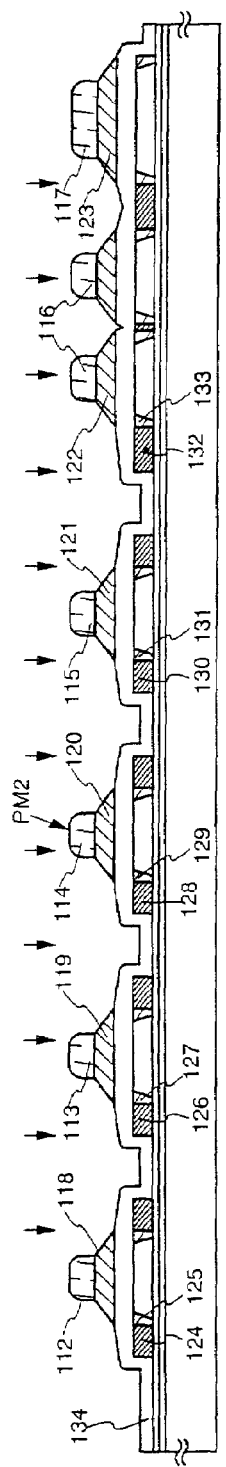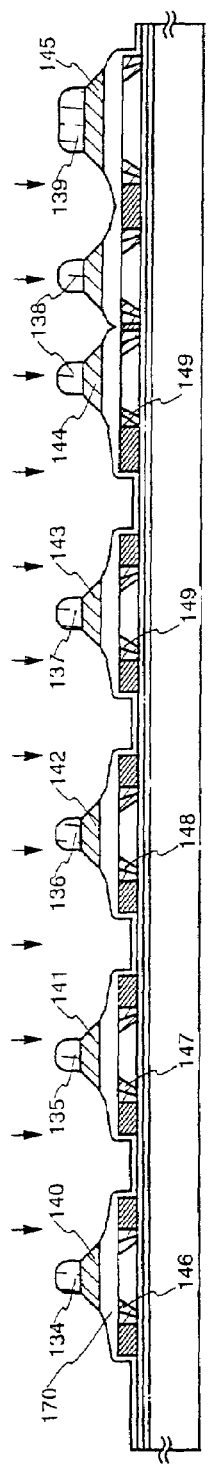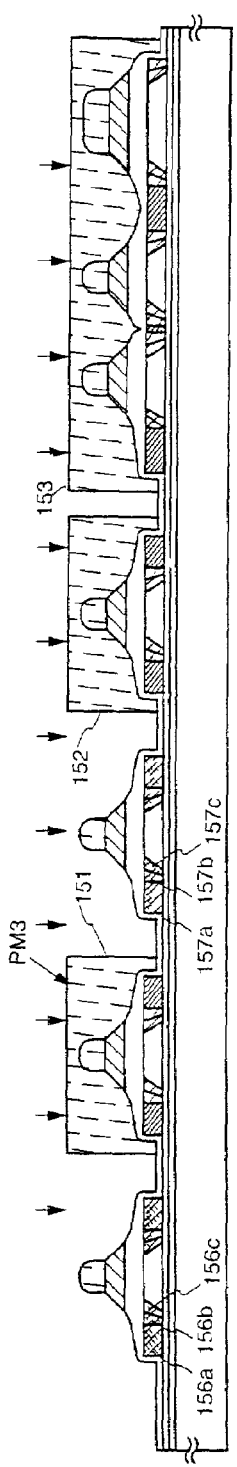

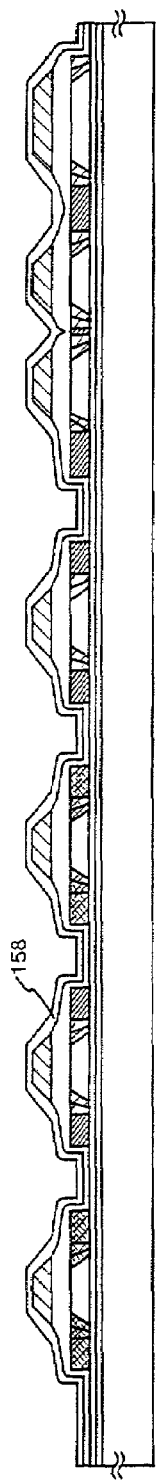
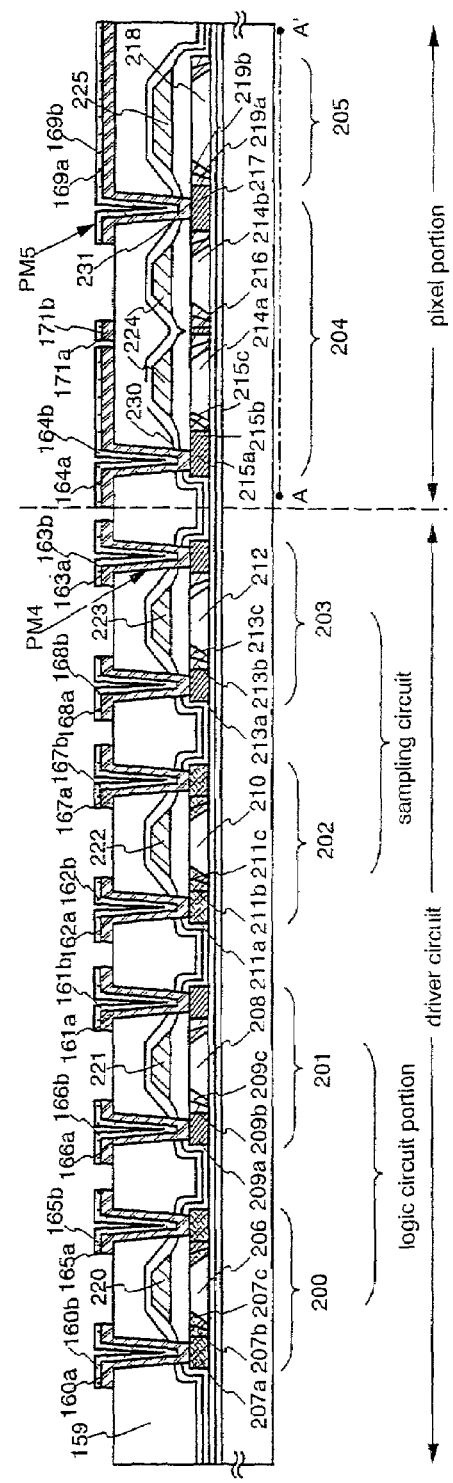
Fig. 6A
Fig. 6B logic circuit portion sampling circuit portion

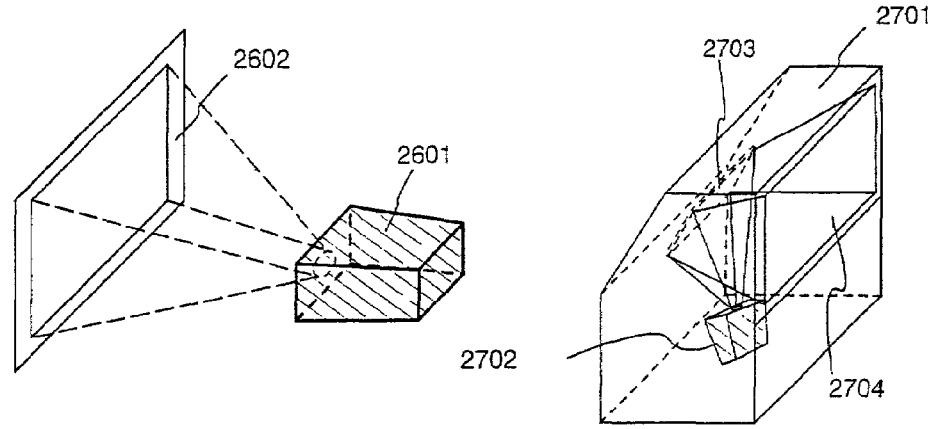
Fig. 21A
Fig. 21B
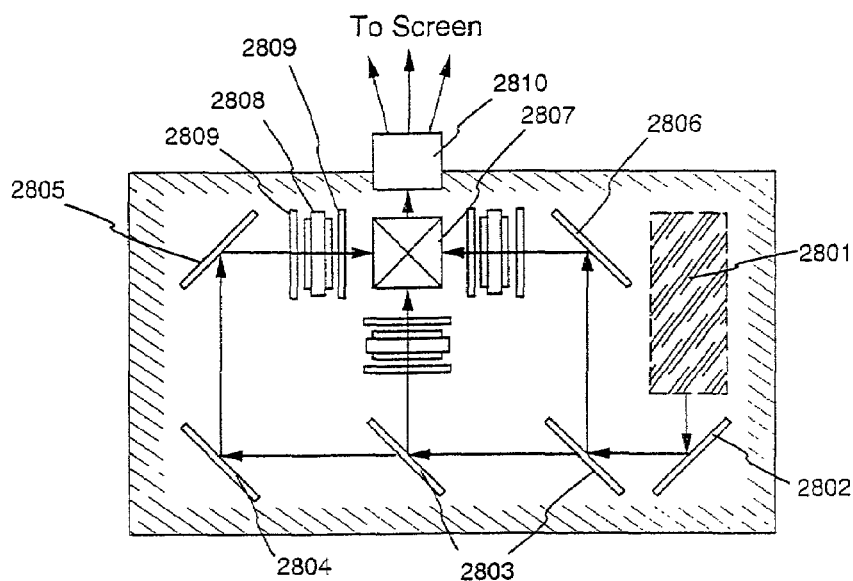
Fig. 21C
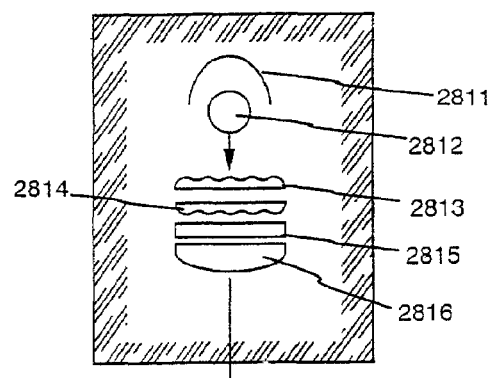
Fig. 21D

METHOD OF MANUFACTURING A SEMICONDUCTOR DEVICE

BACKGROUND OF THE INVENTION

1. Field of the Invention

The present invention relates to a method of manufacturing a semiconductor device that has a circuit configured with a thin film transistor (hereinafter referred to as the TFT). For example, the present invention relates to an optoelectronic device, such as a liquid crystal display panel, and an electronic apparatus comprising such an optoelectronic device as a component.

In the present specification, the term "semiconductor device" refers in general to such a device that exhibits its intended function by employing semiconductor characteristics. Accordingly, all of an optoelectronic device, a semiconductor circuit, and an electronic apparatus are included in the semiconductor devices.

2. Description of the Related Art

Recently, techniques for constituting a thin film transistor (TFT) by employing a semiconductor thin film (having a thickness approximately in the range from several nm to several hundreds nm) formed on a substrate that has an insulating surface has been drawing much attention. The thin film transistor has been widely used in various electronic devices such as an IC and an optoelectronic device. In particular, development of the thin film transistor as a switching element for an image display device has been urged.

A TFT employing a crystalline semiconductor film (typically a polysilicon film or the like) as its semiconductor film has been widely used more often since the crystalline semiconductor film has a larger mobility that that of an amorphous semiconductor film (typically an amorphous silicon film or the like).

However, the polysilicon TFT has an disadvantage in that impurities, defects or the like in a channel forming region tend to have significant adverse effects on TFT characteristics, especially on a threshold characteristic, although the polysilicon TFT has many advantages over the amorphous silicon TFT.

For example, a negative shift of a threshold voltage from 0 V leads to a normally-on characteristic, thereby resulting in the situation in which a normal switching operation cannot be realized.

In order to overcome these problems, it has been known to control a threshold value of a TFT by adding boron ions or the like into a channel forming region with an ion doping apparatus or an ion implantation apparatus.

In general, in an IC fabrication process, impurity ions are selectively implanted with an ion implantation apparatus. In such an ion implantation apparatus, impurity ions are accelerated by means of an electrical field and then a mass separation is performed, so that only target ions are implanted. This ion implantation apparatus can exhibit high precision, although the apparatus is very expensive and its throughput is low. The ion implantation apparatus is not suitable particularly for mass-production of an active matrix display device in which a large-size substrate has to be processed. In view of the above fact, for mass-production of the active matrix display device in which a large-size substrate has to be processed, an ion doping apparatus is typically employed since it can realize a batch process for adding impurity ions into a large-size semiconductor thin film.

In this ion doping apparatus, source material gases are flowed into a chamber and plasmarized therein by a known method, thereby ionizing the contained impurity ions to be added to a crystalline semiconductor film. Although other ions than the target ion species may be added into the film since no mass separation is performed, a satisfactory throughput can be realized.

In the above-mentioned conventional method for controlling a threshold value, it is required to set an amount of boron ions to be added into the channel forming region to an extremely small level. However, when the ion doping apparatus is employed, it has been difficult to precisely control the boron ions of a minute amount to be doped into the channel forming region.

For example, in the case where the boron ions are added into a region to become a channel forming region in a sample (semiconductor substrate) with an ion doping apparatus, boron concentration distributions as shown in FIGS. 23 to 25 can be usually obtained.

Specifically, FIGS. 23 to 25 show graphs indicating boron concentration distributions (obtained by SIMS measurements) in the case where the boron ions are added at an accelerating voltage of 80 keV in accordance with the conventional method. In each of FIGS. 23 to 25, the horizontal axis represents the depth, while the vertical axis represents the concentration.

Moreover, the impurity concentrations contained in the sample prior to the doping process were also measured. FIG. 26 shows the concentration distribution of hydrogen (H) contained in the sample prior to the doping process. Similarly, FIG. 27 shows the concentration distribution of carbon (C), while FIG. 28 shows the concentration distributions of oxygen (O) and nitrogen (N).

As shown in FIGS. 23 to 25, it has been clearly observed that nitrogen (N), oxygen (O), carbon (C), and hydrogen (H) are also added through the doping process in addition to boron. Thus, it is clear that during the doping, the component of the ambient atmosphere are also added into the sample. The present inventors have come to the idea that the thus added ambient atmospheric components may cause the TFT characteristics to be varied.

Since the doping amount has to be controlled depending on various parameters (an RF power, a frequency, a degree of vacuum, a gas concentration, or the like), these parameters are required to be always maintained in the certain ranges. However, even when these parameters were set within the certain ranges, the threshold values varied.

In accordance with the conventional ion doping method, the TFT characteristics such as the threshold characteristic may also be varied due to the ambient atmospheric components unintentionally added, thereby resulting in the fact that the TFT characteristics cannot be precisely controlled.

SUMMARY OF THE INVENTION

The source material gas conventionally used for doping is diborane ($B_2H_6$) of 0.1%, diluted with hydrogen. With this gas, the dopant species ratio in the resultant plasma is low, and furthermore, it takes a long period of time to dose. Accordingly, a larger amount of ambient atmospheric components may be ionized during the process to be simultaneously added into the sample.

As one of the measures to overcome the above-mentioned problems, in accordance with the present invention, the concentration ratio of impurity ions (typically, B, P) with respect to hydrogen is increased, thereby resulting in reduction in the concentrations of the ambient atmospheric components (C, N, O) to be simultaneously added into a semiconductor layer or realizing the situation in which no ambient atmospheric components are added into the semiconductor film.

The TFT including a channel forming region formed in accordance with the present invention can exhibit excellent TFT characteristics with reduced variations for the respective TFT characteristics. According to the present invention, for example, the threshold value that is one of the TFT characteristics can be extremely precisely controlled.

The structure of the present invention disclosed in the present specification relates to a method of manufacturing a semiconductor device in which after an insulating film is formed on a semiconductor film, an impurity element providing the semiconductor film with the p-type conductivity through the insulating film is ion-doped at the concentration in the range from $1 \times 10^{15}$ to $5 \times 10^{17}$ atoms/cm$^3$, comprising the step of doping a boron element into the semiconductor film by employing a source material gas including diborane diluted with hydrogen to the concentration range from 0.5% to 5%, preferably to the range from 0.5% to 1%.

Further, another structure of the present invention relates to a method of manufacturing a semiconductor device, comprising the step of ion-doping an impurity element providing a semiconductor film with the p-type conductivity or an impurity element providing the semiconductor film with the n-type conductivity at the concentration in the range from $1 \times 10^{15}$ to $5 \times 10^{17}$ atoms/cm$^3$, characterized in that the concentration of carbon to be ion-doped simultaneously with the impurity element in the semiconductor film is set to be at $3 \times 10^{17}$ atoms/cm$^3$ or less.

Further, another structure of the present invention relates to a method of manufacturing a semiconductor device, comprising the step of ion-doping an impurity element providing a semiconductor film with the p-type conductivity or an impurity element providing the semiconductor film with the n-type conductivity at the concentration in the range from $1 \times 10^{15}$ to $5 \times 10^{17}$ atoms/cm$^3$, characterized in that the concentration of nitrogen to be ion-doped simultaneously with the impurity element in the semiconductor film is set to be at $1 \times 10^{17}$ atoms/cm$^3$ or less.

Further, another structure of the present invention relates to a method of manufacturing a semiconductor device, comprising the step of ion-doping an impurity element providing a semiconductor film with the p-type conductivity or an impurity element providing the semiconductor film with the n-type conductivity at the concentration in the range from $1 \times 10^{15}$ to $5 \times 10^{17}$ atoms/cm$^3$, characterized in that the concentration of oxygen to be ion-doped simultaneously with the impurity element in the semiconductor film is set to be at $3 \times 10^{17}$ atoms/cm$^3$ or less.

Further, in the above-mentioned respective structures, the method of manufacturing semiconductor device is characterized in that the concentration of hydrogen to be ion-doped simultaneously with the impurity element in the semiconductor film is set to be at $1 \times 10^{19}$ atoms/cm$^3$ or less.

Further, another structure of the present invention relates to a method of manufacturing a semiconductor device, comprising the step of ion-doping an impurity element providing a semiconductor film with the p-type conductivity or an impurity element providing the semiconductor film with the n-type conductivity at the concentration in the range from $1 \times 10^{15}$ to $5 \times 10^{17}$ atoms/cm$^3$, characterized in that the concentration of hydrogen to be ion-doped simultaneously with the impurity element in the semiconductor film is set to be at $1 \times 10^{19}$ atoms/cm$^3$ or less.

Further, in the above-mentioned respective structures, the ion doping is characterized by the fact that no mass separation is performed, which means that a plasma doping method rather than an ion implantation method is performed. In addition, although it may be possible to add only hydrogens into the semiconductor film with the ion implantation method, the resultant implantation depth tends to be very deep since the mass of hydrogen is very small. Accordingly, it is very difficult to add hydrogen to a desired depth at a desired concentration. On the other hand, with the ion doping which does not involve the mass separation, only B atoms, or alternatively B atoms coupled with hydrogen, can be added into the semiconductor film, when a diborane gas is used.

Further, in the above-mentioned respective structures, the ion-doping is characterized in that the doping is performed through an insulating film after the insulating film is formed on the semiconductor film. By adjusting a film thickness of the insulating film, the implantation depth can be adjusted, so that the ions can be implanted to a desired depth in the semiconductor film at a desired concentration. In addition, this insulating film also functions to protect the semiconductor film against contamination derived from the ambient atmosphere. It should be noted that in the case where the ions can be added to a desired depth in the semiconductor film at a desired concentration without providing the insulating film, it is not necessary to provide any insulating film.

Further, in the above-mentioned respective structures, the semiconductor film may function as a channel forming region of the TFT. In other words, the ion doping in the aforementioned method can be referred to as the channel doping.

Furthermore, in the present invention, the ambient atmospheric components (C, N, O) or hydrogen to be simultaneously added during the doping process can be reduced by increasing the ratio of dopants (here, referring to an impurity element that provides the semiconductor with the n-type or p-type conductivity) against the doping gas during the channel doping process.

Further, in the above-mentioned respective structures, the method is characterized in that in the ion-doping step, a gas containing diborane, BF$_2$, or boron is used to dope the impurity element providing the semiconductor film with the p-type conductivity.

Further, in the above-mentioned respective structures, the method is characterized in that in the ion-doping step, either one of gases containing P or As, and phosphine is used, and the impurity element providing the semiconductor film with the n-type conductivity is doped.

Further, in the above-mentioned respective structures, the method is characterized in that the impurity element is boron, and the boron element is doped into the semiconductor film by employing a source material gas that contains diborane diluted with hydrogen to the concentration in the range from 0.5% to 5%.

Further, in the above-mentioned respective structures, the method is characterized in that the impurity element is boron, and the boron element is doped into the semiconductor film by employing a source material gas that contains diborane diluted with hydrogen to the concentration in the range from 0.5% to 1%.

Note that, in the present specification, the term gate electrode refers to a portion of gate wiring positioned above the channel forming region via a gate insulating film.

In addition, the present invention is not limited to the specific means disclosed in the above. In contrast, any means capable of suppressing the addition of ambient atmospheric components to be added during the doping as low as possible, and thereby controlling an amount of impurity ions to be added into a region that is to become the channel forming region to a minute amount (desirably, to the range from $1\times10^{15}$ to $5\times10^{17}$ atoms/cm$^3$), may be employed.

For example, as one of the other means, the concentration of the ambient atmospheric components (C, N, O) to be added into the semiconductor layer may be controlled by adjusting a film thickness of an insulating film deposited on the semiconductor film.

BRIEF DESCRIPTION OF THE DRAWINGS

In the accompanying drawings:

FIGS. 4A through 4D respectively show fabrication steps for an active matrix substrate in accordance with Embodiment 1 of the present invention;

FIGS. 5A through 5C respectively show fabrication steps for an active matrix substrate in accordance with Embodiment 1 of the present invention;

FIGS. 6A and 6B respectively show fabrication steps for an active matrix substrate in accordance with Embodiment 1 of the present invention;

FIGS. 21A through 21D respectively show various electronic apparatuses;

DETAILED DESCRIPTION OF THE PREFERRED EMBODIMENTS

Embodiments of the present invention will be described below.

The present invention is intended to precisely control an added amount of impurity ions (to function as donors or acceptors) contained in a channel forming region by employing an ion doping apparatus.

Figure 1:
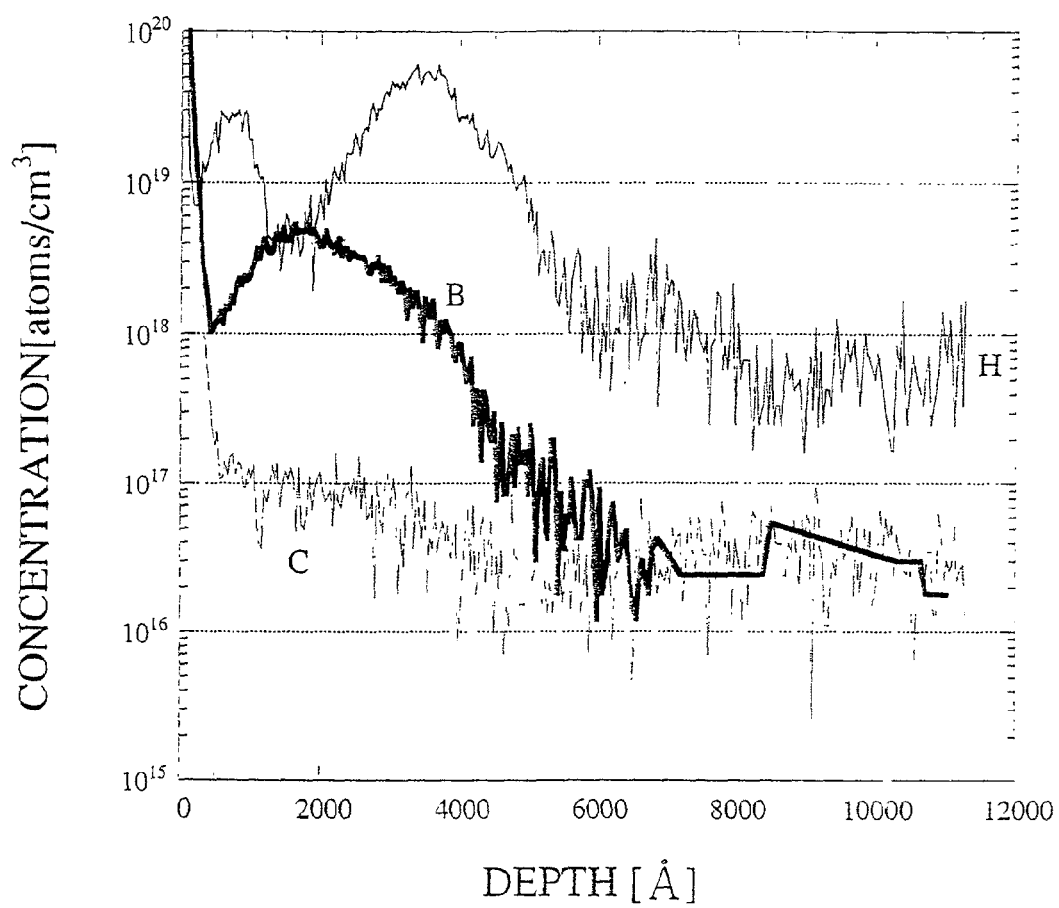
FIG. 1 is a diagram indicating concentration profiles (C, B, H) with the 5% hydrogen diluted B at 80 kV.
Figure 23:
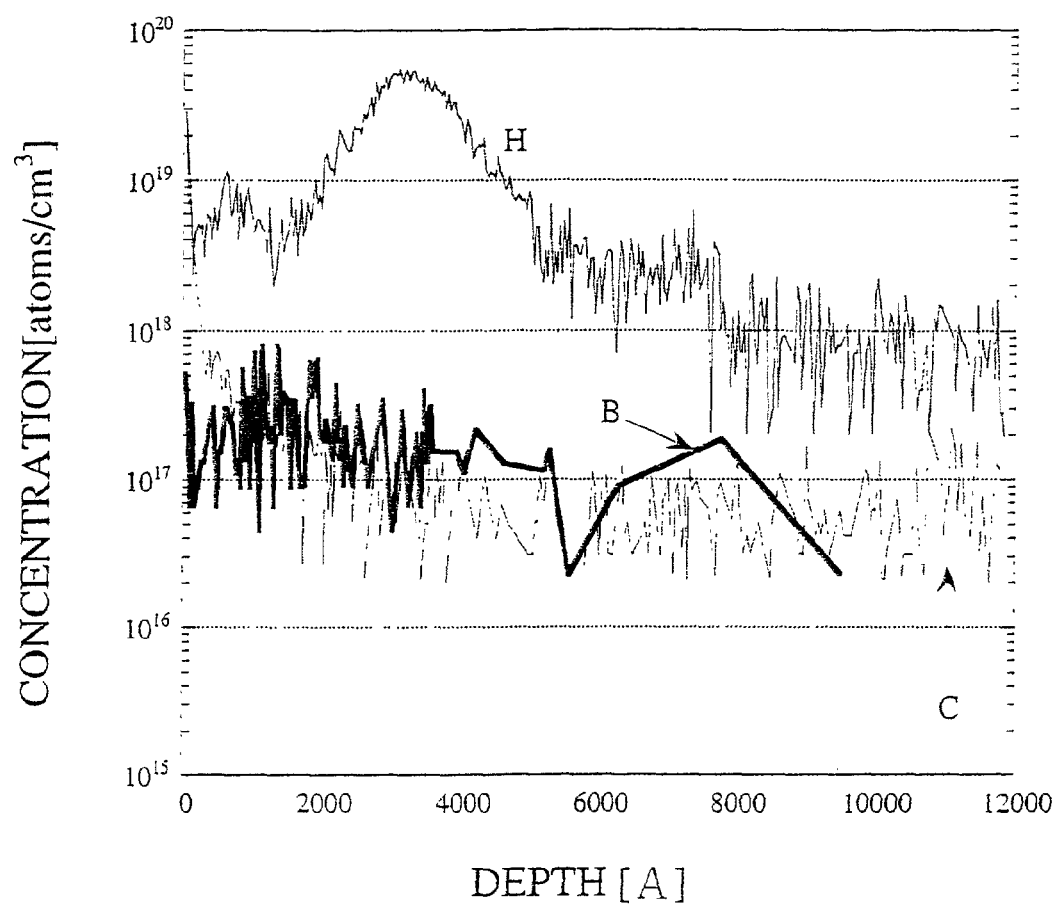
FIG. 23 is a diagram indicating concentration profiles (C, B, H) with the 0.1% hydrogen diluted B at 80 kV.
Figure 24:
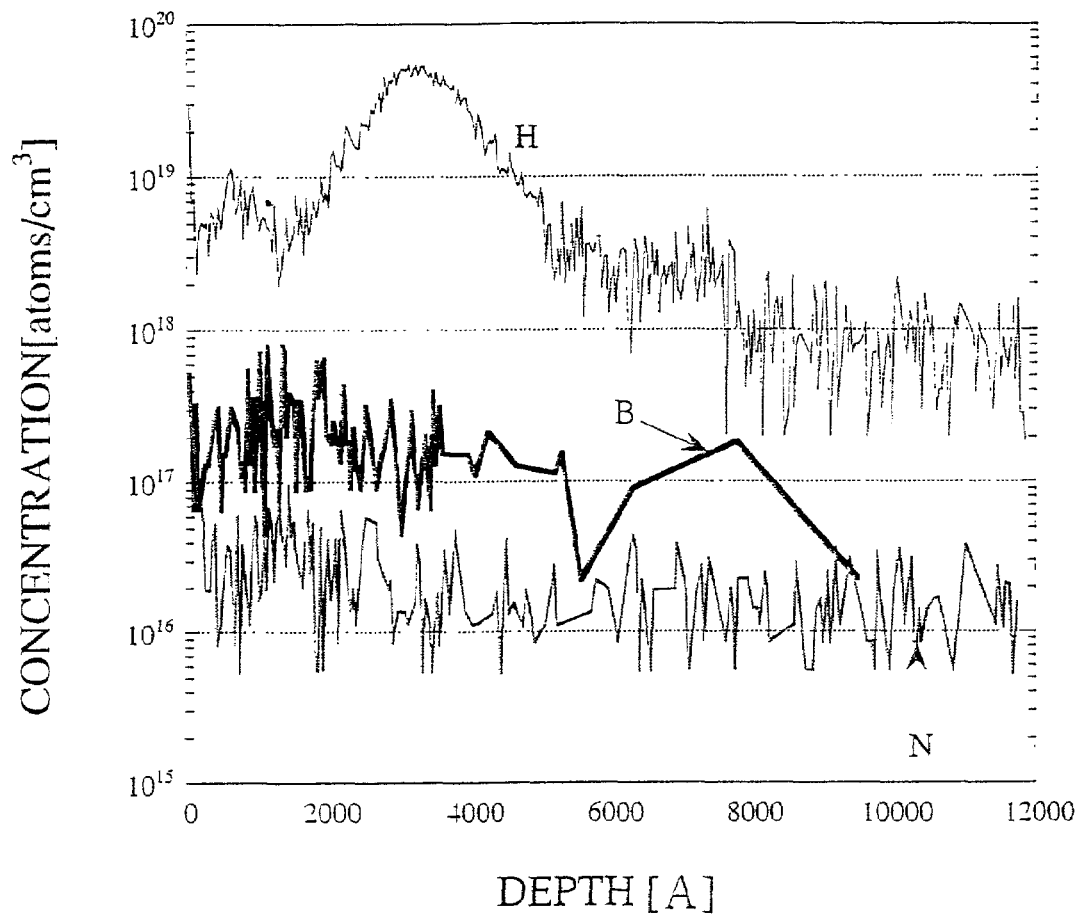
FIG. 24 is a diagram indicating concentration profiles (N, B, H) with the 0.1% hydrogen diluted B at 80 kV.
Figure 25:
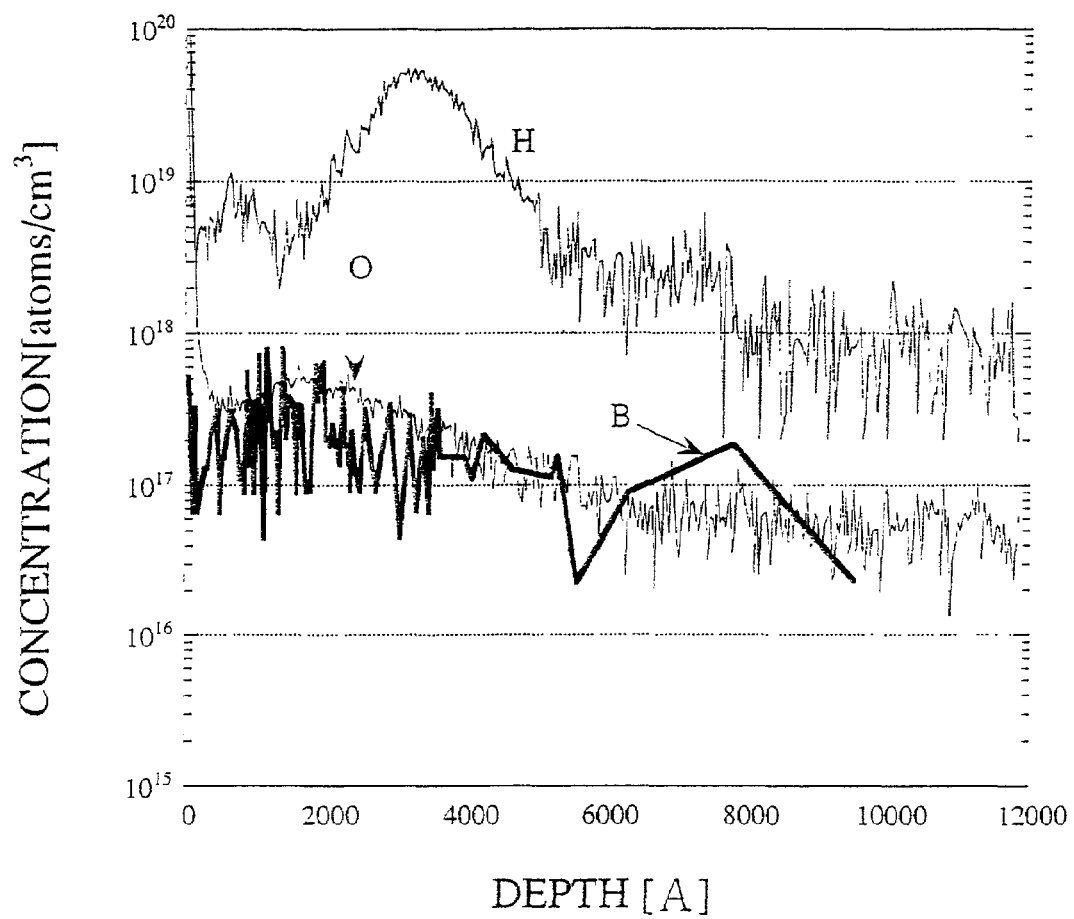
FIG. 25 is a diagram indicating concentration profiles (O, B, H) with the 0.1% hydrogen diluted B at 80 kV.

Among the conditions as employed in FIGS. 23 to 25, a source material gas including diborane diluted with hydrogen to the concentration of 5% instead of 0.1% was used, while the other conditions, for example an ion current density and a total dosage, were set to be at the identical levels. After performing the doping process under these conditions, the impurity concentrations were measured. FIG. 1 shows the thus measured concentrations (B, H, C), FIG. 2 shows the thus measured concentrations (B, H, N), and FIG. 3 shows the thus measured concentrations (B, H, O).

In FIG. 23, it is observed that the concentrations of doped borons and carbons are substantially at the same level. Since boron and carbon have substantially the same molecular amounts, substantially the same concentration profiles (the peak locations) are obtained.

On the other hand, in FIG. 1, it is observed that the carbon concentration shows a concentration profile different from that of the boron concentration, and furthermore is at the reduced level as compared with that in FIG. 23. In FIG. 1, the carbon concentrations in the depth range from 1000 Å to 12000 Å are $1\times10^{15}$ to $2\times10^{17}$ atoms/cm$^3$. In addition, the boron concentration has its peak at around 1500 Å in the range from $1\times10^{15}$ to $5\times10^{18}$ atoms/cm$^3$.

Figure 2:
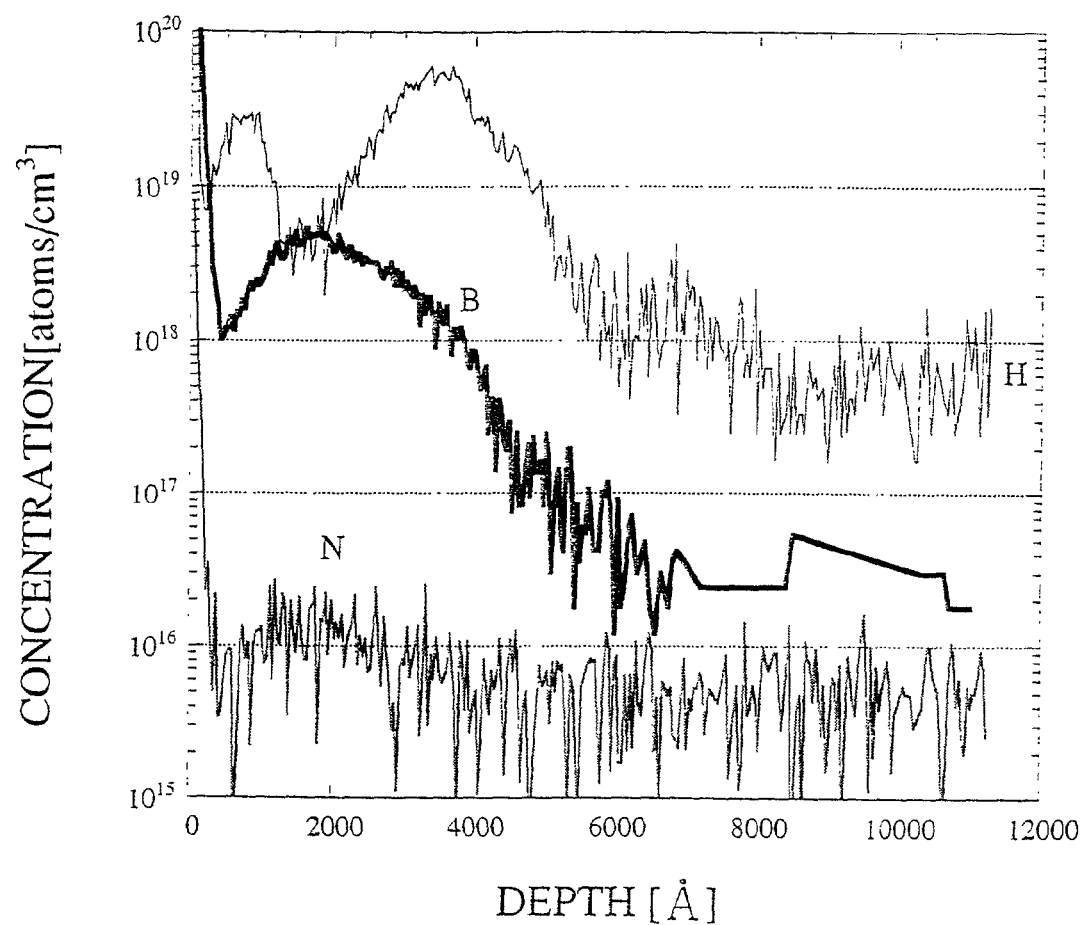
FIG. 2 is a diagram indicating concentration profiles (N, B, H) with the 5% hydrogen diluted B at 80 kV.
Figure 3:
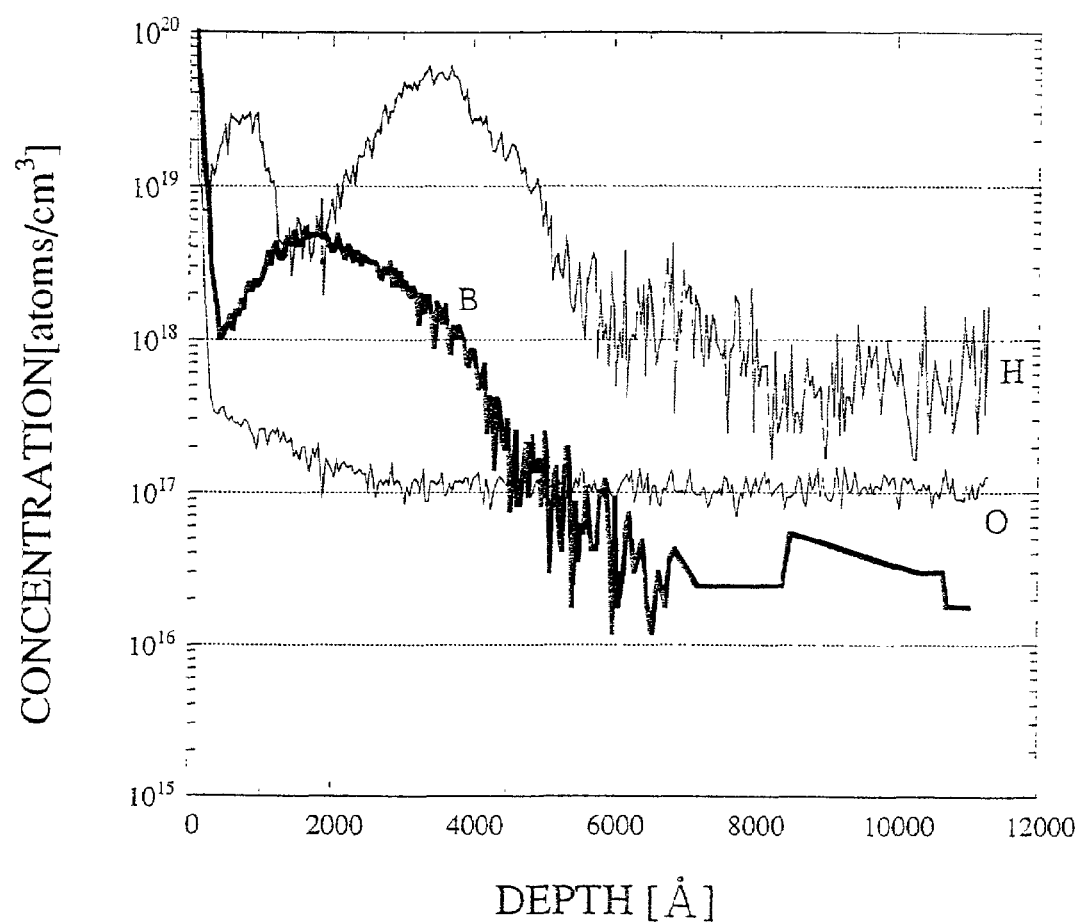
FIG. 3 is a diagram indicating concentration profiles (O, B, H) with the 5% hydrogen diluted B at 80 kV.

Similarly, in FIG. 2, it is observed that the nitrogen concentration is reduced by one-tenth of that in FIG. 24. In FIG. 2, the nitrogen concentrations in the depth range from 1000 Å to 12000 Å are $5\times10^{15}$ to $1\times10^{17}$ atoms/cm$^3$.

In addition, it is also observed that the oxygen concentration in FIG. 3 is reduced as compared to that in FIG. 25. In FIG. 3, the oxygen concentrations in the depth range from 1000 Å to 12000 Å are $8\times10^{15}$ to $5\times10^{17}$ atoms/cm$^3$.

Figure 26:
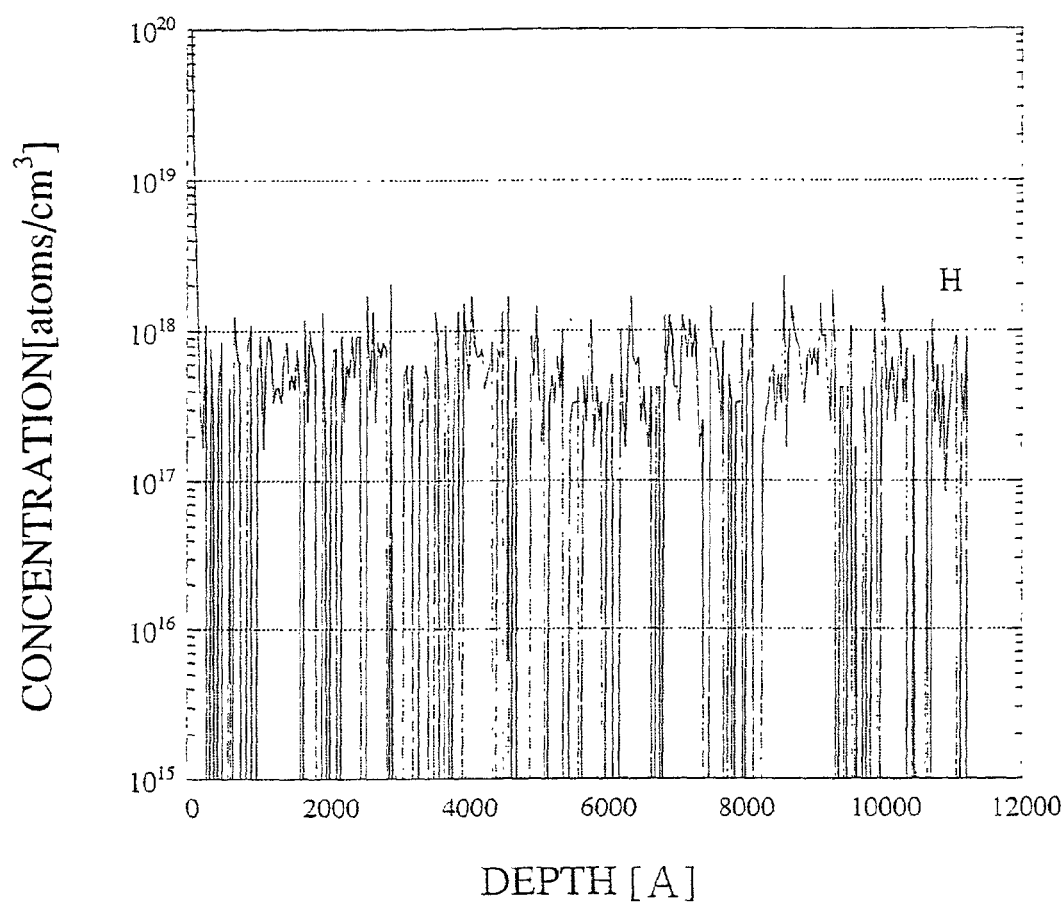
FIG. 26 is a diagram indicating the reference concentration profile (H)
Figure 27:
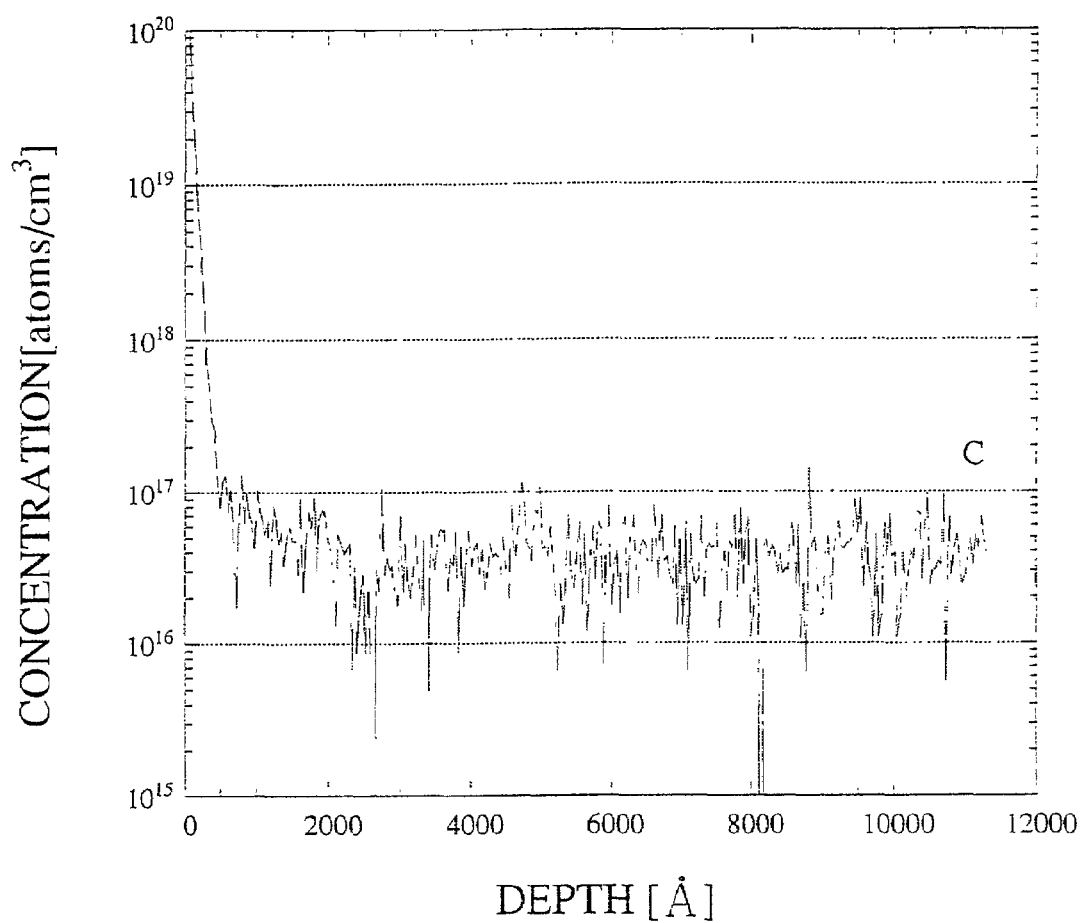
FIG. 27 is a diagram indicating the reference concentration profile (C)
Figure 28:
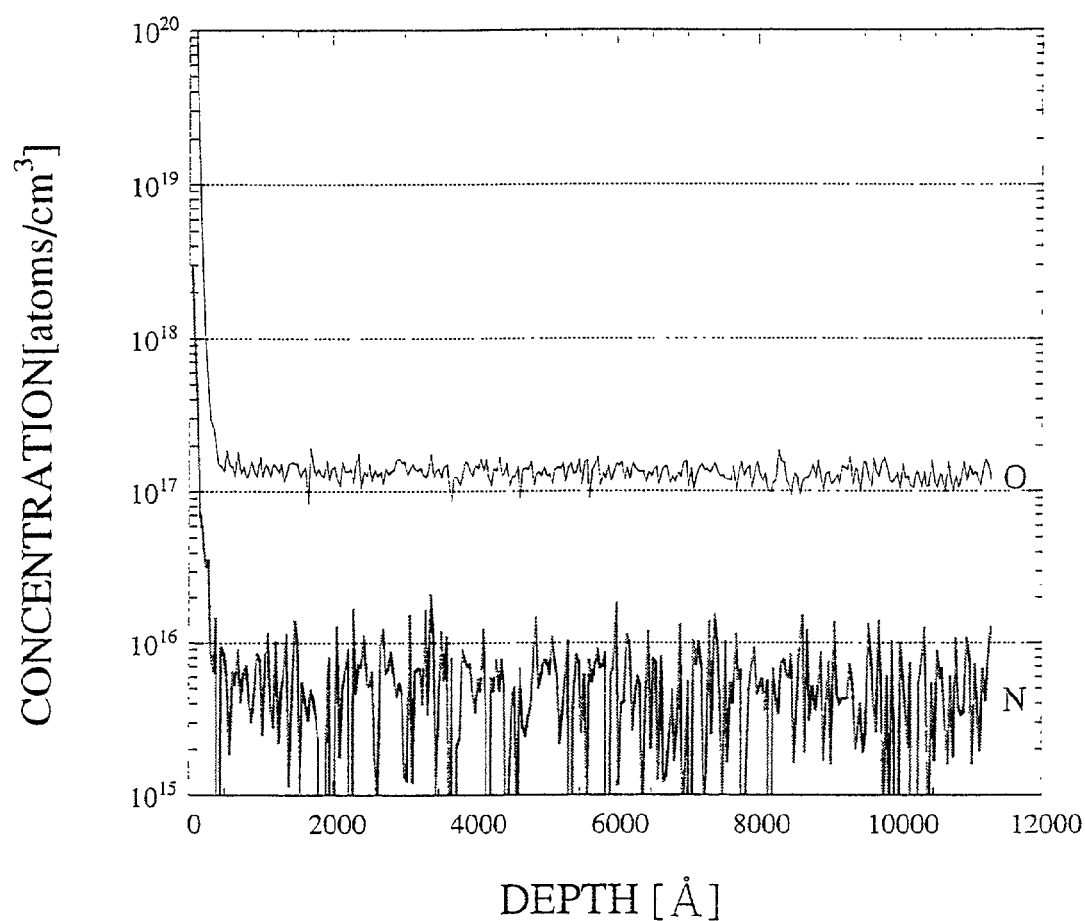
FIG. 28 is a diagram indicating the reference concentration profiles (N, O)

When comparing FIGS. 1 to 3 indicating the data obtained after the doping with the references (FIGS. 26 to 28) indicating the data obtained prior to the doping, the respective concentrations of the ambient atmospheric components (C, N, O) are almost at the same. Thus, it can be seen that almost no ambient atmospheric components (C, N, O) are simultaneously doped into the semiconductor layer at the doping.

This phenomena are derived from the fact that the percentage of boron elements with respect to the total number of atoms in a reaction chamber can be increased by increasing the concentration of diborane. Within the reaction chamber evacuated to the degree of vacuum of $10^{-6}$ to $10^{-7}$ Torr, small amounts of gases of the other elements (C, N, O) still remain. However, when a source material gas having a concentration higher than those gases of the other elements (C, N, O) is flowed into the chamber to perform the doping, almost no other elements (C, N, O) are doped to the sample.

When the concentration of diborane is increased, the percentage of boron elements with respect to the total number of atoms in the reaction chamber can be increased, as set forth above. In addition, the number of ions to be ionized and doped is believed to be limited to a certain level since only a predetermined amount of energy is applied for ionization. This fact is also believed to have a certain effect on the above phenomena. More specifically, in contrast to an increase in the percentage of boron elements, the numbers of ions of the other elements (C, N, O) to be doped are believed to be reduced. Hydrogen atoms are hardly influenced since their percentage with respect to the total number of atoms is extremely high, as compared to the other elements.

It should be noted, however, that by adding hydrogens to the semiconductor layer, the added hydrogens are allowed to be diffused in a subsequent heat treatment process, which improves the TFT characteristics. This advantage cannot be obtained with the ion implantation method in which hydrogen atoms are not simultaneously added to the target semiconductor layer. Moreover, when the impurity elements of the same concentration are intended to be added under the different dilution conditions, a larger amount of hydrogen atoms is added with a lower dilution concentration. For example, with the dilution concentration of 0.1%, more hydrogen atoms of approximately ten times as many as those in the case with the dilution concentration of 5% are added to the semiconductor layer. When a larger amount of hydrogen atoms is added, more damages are applied to the semiconductor layer. Accordingly, it is preferable to set in the semiconductor film, the concentration of hydrogen atoms to be ion doped simultaneously with the impurity elements at $1 \times 10^{19}$ atoms/cm$^3$ or lower.

When the boron concentration of $1 \times 10^{17}$ atoms/cm$^3$ is intended to be realized in the semiconductor layer by employing a source material gas which contains diborane diluted with hydrogen to the concentration of 5%, a period of time to be required for the process is significantly reduced to 16 sec, which makes it difficult to control the apparatus. Accordingly, it is desirable to employ a source material gas including diborane diluted with hydrogen to the concentration in the range from 0.5% to 1%. The above mentioned reduction in the process time is also believed to be related to the fact that almost no ambient atmospheric components (C, N, O) are doped into the semiconductor layer.

The TFT including a channel forming region made of the thus formed semiconductor layer exhibits excellent characteristics, and a desired threshold value can be realized.

Figure 29:
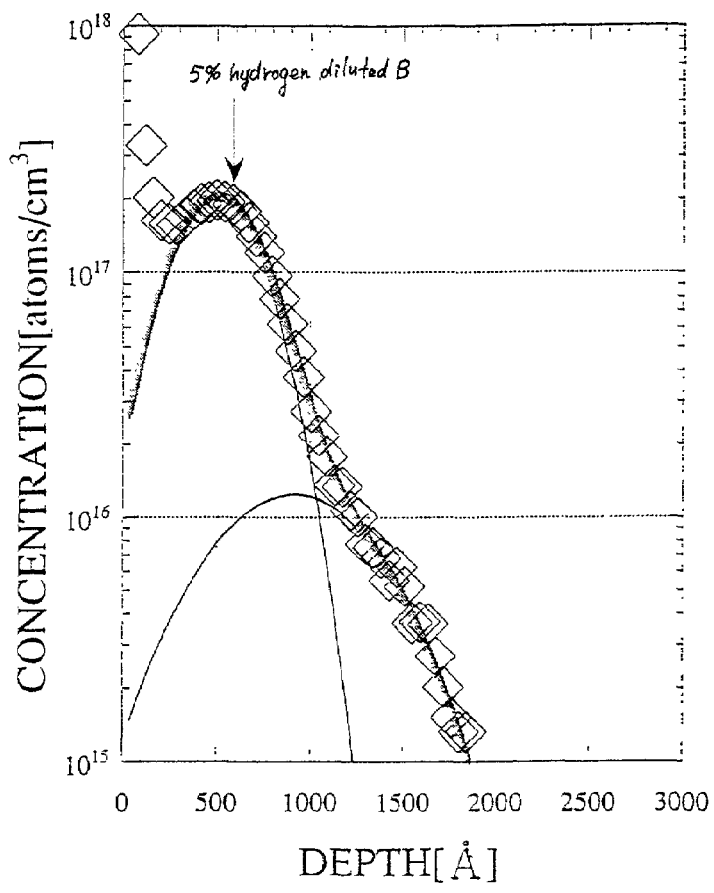
FIG. 29 is a diagram indicating the concentration profile (B) with the 5% hydrogen diluted B at 30 kV fitted to the Gaussian function.

FIG. 29 shows results of the Gaussian function fitting. With the ion doping method, two peaks (one is derived from $B^+$ ions, and the other from $B_2^+$ ions) appear, unlike the case with the ion implantation method. The data in FIG. 29 were obtained with a sample in which a silicon oxide film (4000 Å) is deposited on a semiconductor substrate.

Although the impurity ions are described as boron ions in the above, the present invention is not limited to such a case. Instead of boron, other impurity ions for providing the p-type conductivity, or any impurity ions for providing the n-type conductivity (P ions or As ions), can be used.

In addition, the present invention is not limited to the specific means for increasing the concentration of diborane as disclosed in the above. For example, as one of the other means, the concentration of the ambient atmospheric components (C, N, O) to be added into the semiconductor layer may be controlled by adjusting a film thickness of an insulating film deposited on the semiconductor film. This utilizes the fact that different ions exhibit different implantation depths and distributions due to differences in molecular weights or the like.

Although the above data have been obtained with semiconductor substrates as the samples, the same phenomena as set forth above can be observed with respect to a semiconductor film formed on a semiconductor substrate. In particular, by applying the above-mentioned method to a process for performing the doping to form a channel forming region of the TFT, impurity elements providing the n-type or p-type conductivity can be added at a desired concentration, thereby resulted in a desired threshold voltage being realized.

The present invention having the above-described features will be further described in more detail with respect to the following embodiments.

Embodiment 1

One of embodiments of the present invention will be described with reference to FIGS. 4A to 4D, 5A to 5C, 6A, and 6B. In particular, a method for simultaneously forming a pixel TFT and a retaining capacitance in a pixel portion as well as a TFT in a driver circuit to be disposed in the peripheral portion of the pixel portion will be described in detail.

In FIG. 4A, as a substrate 101, a glass substrate made of, e.g., barium borosilicate glass, aluminum borosilicate glass, such as a #7059 glass or a #1737 glass available from Corning, may be used. Alternatively, a quartz substrate may be used as the substrate 101. In the case where the glass substrate is employed, the substrate 101 may be heat treated in advance at a temperature lower than the glass deformation temperature by about 10 to 20° C. Then, an underlying film 102 made of an insulating film such as a silicon oxide film, a silicon nitride film, or a silicon oxynitride film is formed on a surface of the substrate 101 in which a TFT is to be formed, in order to prevent impurities from being diffused from the substrate 101. For example, a silicon oxynitride film 102a is formed from SiH$_4$, NH$_3$, and N$_2$O with a plasma CVD method to have a thickness of 10 to 200 nm (preferably 50 to 100 nm), and then a hydrogenated silicon oxynitride film 102b is formed similarly from SiH$_4$ and N$_2$O to have a thickness of 50 to 200 nm (preferably 100 to 150 nm). Although the underlying film 102 is described to have a two-layer structure, a single layer of an insulating film may be deposited. Alternatively, two or more layers of insulating films may be deposited as the underlying film 102.

A silicon oxynitride film is formed with a parallel-plate type plasma CVD method. For forming the silicon oxynitride film 102a, SiH$_4$ of 10 sccm, NH$_3$ of 100 sccm, and N$_2$O of 20 sccm are introduced into the reaction chamber. Other parameters are set as follows: a substrate temperature of 325° C., a reaction pressure of 40 Pa, a discharge power density of 0.41 W/cm$^2$, and a discharge frequency of 60 MHz. On the other hand, for forming the hydrogenated oxynitride silicon film 102b, SiH$_4$ of 5 sccm, N$_2$O of 120 sccm, and H$_2$ of 125 sccm are introduced into the reaction chamber. Other parameters are set as follows: a substrate temperature of 400° C., a reaction pressure of 20 Pa, a discharge power density of 0.41 W/cm$^2$, and a discharge frequency of 60 MHz. These two films can be continuously formed only by changing the substrate temperature and switching the reaction gases to be used.

The thus formed oxynitride silicon film 102*a* has a density of $9.28 \times 10^{22}/cm^3$. This is a fine and hard film that exhibits a slow etching rate of about 63 nm/min at 20° C. against a mixture solution (available from Stella Chemifa under commercial designation of LAL500) which contains hydrogen fluoride ammonium ($NH_4HF_2$) of 7.13% and ammonium fluoride ($NH_4F$) of 15.4%. Such a film used as the underlying film is effective for preventing alkaline metal elements from being diffused from the glass substrate into the semiconductor layer formed on the underlying film.

Then, a semiconductor layer 103*a* with a thickness of 25 to 80 nm (preferably 30 to 60 nm) and having an amorphous structure is formed with a plasma CVD method, a sputtering method, or the like. A semiconductor film having an amorphous structure includes an amorphous semiconductor film and a microcrystalline semiconductor film. Alternatively, a compound semiconductor film having an amorphous structure such as an amorphous silicon germanium film may be employed. In the case where the amorphous silicon film is formed with a plasma CVD method, it is possible to continuously form both of the underlying film 102 and the amorphous semiconductor layer 103*a*. For example, after depositing the silicon oxynitride film 102*a* and the hydrogenated silicon oxynitride film 102*b* with a plasma CVD method as set forth above, the reaction gases are switched from the combination of $SiH_4$, $N_2O$ and $H_2$ to the combination of $SiH_4$ and $H_2$, or only $SiH_4$. Then, these films can be continuously deposited without being exposed to the ambient atmosphere. As a result, surface contamination of the hydrogenated silicon oxynitride film 102*b* can be prevented, and variations in the characteristics and/or a threshold voltage of the resultant TFTs can be reduced.

Thereafter, a crystallization process is performed to form a crystalline semiconductor layer 103*b* from the amorphous semiconductor layer 103*a*. For that purpose, various methods such as a laser annealing method, a thermal annealing method (a solid phase growth method), or a rapid thermal annealing method (RTA method) can be employed. In the case where the glass substrate or a plastic substrate that has poor heat-resistivity is to be employed, a laser annealing method is especially preferable to be performed. In the RTA method, an infrared lamp, a halogen lamp, a metal halide lamp, a Xenon lamp or the like is used as a light source. Alternatively, in accordance with the technique disclosed in Japanese Patent Application Laid-Open No. Hei 7-130652, the crystalline semiconductor layer 103*b* may be formed through a crystallization process employing catalytic elements. In the crystallization process, it is preferable to allow the hydrogens contained in the amorphous semiconductor layer to be first purged. For that purpose, a heat process is performed at 400 to 500° C. for about one hour, so that the amount of hydrogens contained in the amorphous semiconductor layer is reduced to 5 atom % or lower. By performing the crystallization process thereafter, the surface of the resultant crystallized film can be prevented from being roughened.

Alternatively, when an $SiH_4$ gas and an Ar gas are used as the reaction gases and the substrate temperature is set at 400 to 450° C. during the formation process of the amorphous silicon film with the plasma CVD method, the amount of hydrogens contained in the amorphous silicon film can be reduced to 5 atom % or lower. In such a case, no heat treatment is required to be performed for purging the contained hydrogens.

In the case where the crystallization is performed with the laser annealing method, an excimer laser or an Ar laser of a pulse-oscillation type or a continuous-emission type is used as its light source. When an excimer laser of the pulse-oscillation type is used, the laser rays are shaped into a linear shape and the laser annealing process is then performed. Although the laser annealing conditions can be appropriately set, for example, a laser pulse oscillation frequency is set at 30 Hz, and a laser energy density is set in the range from 100 to 500 $mJ/cm^2$ (typically in the range from 300 to 400 $mJ/cm^2$). The entire substrate surface is then irradiated with the linear beam with an overlapping ratio of the linear beams at 80 to 98%. Thus, the crystalline semiconductor layer 103*b* can be obtained as shown in FIG. 4B.

Then, a resist pattern is formed on the crystalline semiconductor layer 103*b* with a photolithography technique by employing a first photomask (PM1). The crystalline semiconductor layer is divided into island-patterns by dry-etching to form island-shaped semiconductor layers 104 to 108, as shown in FIG. 4C. For the dry etching process of the crystalline silicon film, a mixture gas of $CF_4$ and $O_2$ is used.

A mask layer made of a silicon oxide film having a thickness of 50 to 200 nm is then formed with a plasma CVD method or a sputtering method. In this embodiment, a silicon oxide film having a thickness of 130 nm is formed.

Thereafter, impurity elements providing the p-type conductivity are added to the entire surfaces of the island-shaped semiconductor layers at the concentration of about $1 \times 10^{16}$ to $5 \times 10^{17}$ atoms/$cm^3$ for the purpose of controlling a threshold voltage (Vth) of TFTs. As the impurity elements providing the semiconductor material with the p-type conductivity, elements in Group 13 in the periodic table, such as boron (B), aluminum (Al), and gallium (Ga) are known. As the method for adding the impurity elements, the ion doping method as mentioned above is suitable. With the ion doping method, boron (B) is added by employing, as a source material gas, diborane ($B_2H_6$) diluted with hydrogens to the concentration of 0.5 to 5%, preferably 0.5 to 1%. In this embodiment, diborane diluted with hydrogens to the concentration of 5% is used as a source material gas, and the other parameters are set as follows: an accelerating voltage of 80 keV, a flow rate of 25 sccm, a current density of 50 nA, and a process period of time of 39.4 sec. Thus, borons are added to the entire surfaces of the island-shaped semiconductor layers at the concentration of about $2.6 \times 10^{17}$ atoms/$cm^3$. By setting the concentration of diborane at 5%, amounts of the impurity elements (carbon, nitrogen, oxygen) other than boron to be simultaneously added during the doping can be reduced.

Although the impurities are added into the whole surface in the above, it is also possible to selectively add the impurities through a mask. This process is called as a channel doping process, which is preferably employed for setting a threshold voltage of, especially an n-channel TFT, within a predetermined range.

The mask layer used for the control of the doping amount is then removed. Alternatively, it is possible to employ this insulating film as a gate insulating film or a portion thereof, in order to reduce the number of steps to be involved.

A gate insulating film 109 is then formed. The gate insulating film 109 is formed by depositing an insulating film containing silicon to have a film thickness of 40 to 150 nm with a plasma CVD method or a sputtering method. In this embodiment, the gate insulating film 109 is formed of a silicon oxynitride film having a thickness of 120 nm. The silicon oxynitride film formed with the source material gases obtained by adding $O_2$ into $SiH_4$ and $N_2O$ is a suitable material for the purpose since the fixed charge density in the film is reduced. Furthermore, the silicon oxynitride film formed with the source material gases of $SiH_4$ and $N_2O$ as well as $H_2$ is preferable since the interface defect density at the interface with the gate insulating film can be reduced. It should be noted that the gate insulating film is not limited to such a silicon oxynitride film, but a single-layer structure or a multilayer structure of other insulating films containing silicon may be used. For example, in the case where a silicon oxide film is used, the film can be formed with a plasma CVD method in which TEOS (Tetraethyl Orthosilicate) and $O_2$ are mixed to each other, and a discharge is generated with a reaction pressure of 40 Pa, a substrate temperature of 300 to 400° C., and a high frequency (13.56 MHz) power density of 0.5 to 0.8 $W/cm^2$. The thus formed silicon oxide film can exhibit satisfactory characteristics as a gate insulating film by being subjected to a thermal annealing process at 400 to 500° C.

Thereafter, as shown in FIG. 4D, a heat-resistant conductive layer 111 for forming a gate electrode is formed on the gate insulating film 109 with a first shape so as to have a thickness of 200 to 400 nm (preferably 250 to 350 nm). The heat-resistant conductive layer may be a single layer, or alternatively, have a layered-structure including a plurality of layers such as two or three layers, if necessary. The heat-resistive conductive layer in the present specification includes a film made of elements selected from the group consisting of Ta, Ti, and W, an alloy film including the aforementioned elements as constituent components, or an alloy film in which the aforementioned elements are combined. These heat-resistive conductive layers can be formed with a sputtering method or a CVD method, and it is preferable to reduce the concentration of impurities contained therein in order to obtain a low resistance. Especially, the oxygen concentration is preferably set to be at 30 ppm or lower. In this embodiment, the W film may be formed to have a thickness of 300 nm. The W film may be formed with a sputtering method employing a W target, or with a thermal CVD method employing hexafulouride tungsten ($WF_6$). In either case, the resistance of the film is required to be lowered in order to be used as a gate electrode, so that the resistivity of the resultant W film is preferably set to be at 20 $\mu\Omega \cdot cm$ or lower. The W film can have a lower resistivity with a larger grain size. However, when a larger amount of impurity elements such as oxygens is contained in the W film, crystallization is adversely affected to cause high resistance. Thus, in the case where a sputtering method is employed to form a W film, a W target with the purity of 99.9999% is employed, and sufficient attention is paid so as to prevent impurities from being mixed into the W film from the ambient atmosphere during the deposition, thereby resulting in a resistivity of 9 to 20 $\mu\Omega \cdot cm$.

On the other hand, in the case where a Ta film is used as the heat-resistive conductive layer 111, the film can be similarly formed with a sputtering method. For the Ta film, an Ar gas is used as a sputtering gas. In addition, when an appropriate amount of Xe or Kr is added into the gas during the sputtering process, an internal stress of the resultant film can be relaxed so that the film can be prevented from being peeled off. The resistivity of the α-phase Ta film is about 20 $\mu\Omega \cdot cm$, and thus can be used as a gate electrode. However, the β-phase Ta film has the resistivity of about 180 $\mu\Omega \cdot cm$, which is not suitable for forming a gate electrode. Since the TaN film has a crystal structure close to that of the α-phase Ta film, the α-phase Ta film can be easily obtained by forming the underlying TaN film prior to the deposition of the Ta film. In addition, although not illustrated, it is effective to form a silicon film having a thickness of about 2 to 20 nm and doped with phosphorus (P) below the heat-resistive conductive layer 111. Thus, close adhesion to the overlying conductive film as well as prevention of oxidation can be realized, and furthermore, alkaline metal elements contained in the heat-resistive conductive layer 111 at a minute amount can be prevented from being diffused into the gate insulating film 109 having the first shape. In either case, it is preferable to set the resistivity of the heat-resistive conductive layer 111 in the range from 10 to 50 $\mu\Omega \cdot cm$.

Then, other masks 112 to 117 made of a resist are formed with a photolithography technique by employing a second photomask (PM2). A first etching process is then performed. In this embodiment, an ICP etching apparatus is employed with $Cl_2$ and $CF_4$ as etching gases, and the etching is performed by forming plasma with an applied RF (13.56 MHz) power of 3.2 $mW/cm^2$ under a pressure of 1 Pa. An RF (13.56 MHz) power of 224 $mW/cm^2$ is also applied to the substrate (to a sample stage), so that substantially a negative self-biasing voltage can be applied. An etching speed of the W film under the above conditions is about 100 nm/min. In the first etching process, a time period required for the W film to be just etched away is calculated based on the above-mentioned etching speed, and the resultant time period is increased by 20% to be set as the actual etching time period.

Conductive layers 118 to 123 having a first tapered shape are formed through the first etching process. As shown in FIG. 2A, the tapered angle of 15 to 30 degrees can be obtained. In order to perform the etching process without remaining any etching residue, overetching is performed in which an etching time is increased by 10 to 20%. A selection ratio of the silicon oxynitride film (the gate insulating film 109 having the first shape) with respect to the W film is about 2 to 4 (typically 3), and therefore, the exposed surface of the silicon oxynitride film can be etched away by about 20 to 50 nm through the overetching, so that a gate insulating film 134 can be formed to have a second shape in which tapered shapes are formed in the vicinity of end portions of the conductive layer having the first tapered shape.

Thereafter, a first doping process is performed so that impurity elements with one conductivity type are added into the island-shaped semiconductor layers. In this embodiment, the impurity elements providing the n-type conductivity are added. The masks 112 to 117 used for forming the first-shaped conductive layers are remained, and the conductive layers 118 to 123 having the first tapered shapes are used as masks so that the impurity elements for providing the n-type conductivity are added with the ion doping method in a self-aligning manner. In order that the impurity elements for providing the n-type conductivity are added so as to pass through the tapered portion and the gate insulating film at the end portion of the gate electrode and reach the underlying semiconductor layer, the dosage is set in the range from $1 \times 10^{13}$ to $5 \times 10^{14}$ atoms/$cm^2$ and the accelerating voltage is set in the range from 80 to 160 keV. As the impurity elements for providing the n-type conductivity, elements in Group 15 in the periodic table, typically phosphorus (P) or arsenic (As), can be used. In this embodiment, phosphorus (P) is used. Through the above-described ion doping method, the impurity elements for providing the n-type conductivity are added to first impurity regions 124 to 128 in the concentration range from $1 \times 10^{20}$ to $1 \times 10^{21}$ atoms/$cm^3$, while the impurity elements for providing the n-type conductivity are added to a second impurity regions (A) formed below the tapered portions in the concentration range from $1\times10^{17}$ to $1\times10^{20}$ atoms/cm$^3$ (although not necessarily uniformly added in the regions).

In this process, in the second impurity regions (A) 129 to 132, the concentration profiles of the impurity elements for providing the n-type conductivity to be contained in at least portions overlapping with the first-shaped conductive layers 118 to 123 reflect changes in the film thickness of the tapered portions. More specifically, the concentration of phosphorus (P) to be added into the second impurity regions (A) 129 to 132 in the regions overlapping with the first-shaped conductive layers is gradually reduced inwardly from the end portion of the conductive layer. This is because the concentration of phosphorus (P) that can reach the semiconductor layer is changed depending on differences in the film thickness of the tapered portions.

Then, as shown in FIG. 5B, a second etching process is performed. This etching process is similarly performed with the IPC etching apparatus by employing a mixture gas of CF$_4$ and Cl$_2$ as an etching gas under the conditions of an applied RF power of 3.2 W/cm$^2$ (13.56 MHz) and a bias power of 45 mW/cm$^2$ (13.56 MHz) under a pressure of 1.0 Pa. Thus, conductive layers 140 to 145 are formed to have a second shape obtainable under these conditions. Tapered portions are formed at respective end portions thereof, in which a thickness is gradually increased inwardly from the respective end portions. As compared with the first etching process, an isotropic etching component is increased due to a reduction in the bias power to be applied to the substrate side, so that the tapered portions are formed to have an angle of 30 to 60 degrees. In addition, the surfaces of the gate insulating films 134 having the second shape are etched way by about 40 nm, and third gate insulating films 170 are newly formed.

Thereafter, the impurity elements for providing the n-type conductivity are doped with a reduced dosage at a higher accelerating voltage, as compared to the first doping process. For example, the accelerating voltage is set in the range from 70 to 120 keV and the dosage is set at $1\times10^{13}$ atoms/cm$^2$. The concentrations of the impurity elements to be included in the regions overlapping with the conductive layers 140 to 145 having the second shape are set to be in the range from $1\times10^{16}$ to $1\times10^{18}$ atoms/cm$^3$. Thus, the second impurity regions (B) 146 to 150 are formed.

Then, impurity regions 156 and 157 with the opposite conductivity are formed in the island-shaped conductive layers 104 and 106 that constitute p-channel TFTs. The impurity elements for providing the p-type conductivity are doped with the second-shaped conductive layers 140 and 142 as masks to form the impurity regions in a self-aligning manner. In this case, the island-shaped semiconductor layers 105, 107, 108 that constitute the n-channel TFTs are entirely covered with resist masks 151 to 153 formed by employing a third photomask (PM3). The impurity regions 156 and 157 in this stage are formed with the ion doping method employing diborane (B$_2$H$_6$). The concentrations of the impurity elements for providing the p-type conductivity in the impurity regions 156 and 157 are set in the range from $2\times10^{20}$ to $2\times10^{21}$ atoms/cm$^3$.

However, these impurity regions 156 and 157 when viewed in more detail can be divided into three regions containing the impurity elements for providing the n-type conductivity. More specifically, third impurity regions 156a and 157a contain the impurity elements for providing the n-type conductivity in the range from $1\times10^{20}$ to $1\times10^{21}$ atoms/cm$^3$, fourth impurity regions (A) 156b and 157b contain the impurity elements for providing the n-type conductivity in the range from $1\times10^{17}$ to $1\times10^{20}$ atoms/cm$^3$, and the fourth impurity regions (B) 156c and 157c contain the impurity elements for providing the n-type conductivity in the range from $1\times10^{16}$ to $5\times10^{18}$ atoms/cm$^3$. However, when the concentrations of the impurity elements for providing the p-type conductivity are set to be at $1\times10^{19}$ atoms/cm$^3$ or more in the impurity regions 156b, 156c, 157b, and 157c, and the concentrations of the impurity elements for providing the p-type conductivity are set to become 1.5 to 3 times larger in the third impurity regions 156a and 157a, no adverse problems occur for allowing the third impurity regions to function as source and drain regions of the p-channel TFTs. In addition, portions of the fourth impurity regions (B) 156c and 157c are formed to overlap with the conductive layer 140 or 142 having the second tapered shape.

Thereafter, as shown in FIG. 6A, a first interlayer insulating film 158 is formed over the gate electrodes and the gate insulating films. The first interlayer insulating film may be formed of a silicon oxide film, a silicon nitride film, a silicon oxynitride film, or a layered film in which these films are combined. In either case, the first interlayer insulating film 158 is formed of an inorganic insulating material. The film thickness of the first interlayer insulating film 158 is set to be in the range from 100 to 200 nm. When a silicon oxide film is to be employed, the film is formed with the plasma CVD method in which TEOS and O$_2$ are mixed to each other, and the discharge is generated under the conditions of a reaction pressure of 40 Pa, a substrate temperature in the range of 300 to 400° C., and a high frequency (13.56 MHz) power density of 0.5 to 0.8 W/cm$^2$. When a silicon oxynitride film is to be employed, the film is formed of a silicon oxynitride film formed with the plasma CVD method from SiH$_4$, N$_2$O, and NH$_3$, or a silicon oxynitride film formed with the plasma CVD method from SiH$_4$ and N$_2$O. The film formation conditions in these cases are set as follows: a reaction pressure in the range from 20 to 200 Pa, a substrate temperature in the range of 300 to 400° C., and a high frequency (60 MHz) power density of 0.1 to 1.0 W/cm$^2$. Alternatively, a hydrogenated silicon oxynitride film formed from SiH$_4$, N$_2$O, and H$_2$ may also be used. A silicon nitride film can also be formed with a plasma CVD method from SiH$_4$ and NH$_3$.

Then, a process for activating the impurity elements providing the p-type and n-type conductivities added at the respective concentrations is performed. This process is realized as a thermal annealing method which employs a furnace anneal oven. Alternatively, a laser annealing method, or a rapid thermal annealing method (RTA method) may be applied for that purpose. The thermal annealing is performed within a nitrogen atmosphere having the oxygen concentration of 1 ppm or lower, preferably 0.1 ppm or lower, at 400 to 700° C., typically 500 to 600° C. In this embodiment, the thermal annealing is performed at 550° C. for 4 hours. In the case where a plastic substrate having a low heating endurance temperature is employed, a laser annealing method is preferably employed.

After the activation process, the surrounding atmospheric gases are switched to a hydrogen atmosphere containing hydrogens at the concentration of 3 to 100%. A heat process is performed in this atmosphere at 300 to 450° C. for 1 to 12 hours so that the island-shaped semiconductor layers are hydrogenated. In this process, dangling bonds existing in the island-shaped semiconductor layers at the concentration of $10^{16}$ to $10^{18}$/cm$^3$ are terminated with thermally excited hydrogens. As another means for the hydrogenation, plasma hydrogenation (in which hydrogens excited by means of plasma are employed) may be performed. In either case, the defect densities in the island-shaped semiconductor layers 104 to 108 are preferably set to be at $10^{16}/cm^3$ or lower. For that purpose, hydrogens are added at the concentration of about 0.01 to 0.1 atomic %.

Then, a second interlayer insulating film made of an organic insulating material is formed to cover the first interlayer insulating film. As the organic insulating material, polyimide, polyamide, polyimideamide, BCB (benzocyclobutene), or the like may be used.

By thus forming the second interlayer insulating film of an organic insulating material, the surface thereof can be easily planarized. In addition, since the organic insulating material has in general a low dielectric constant, a parasitic capacitance can be reduced. However, the organic insulating material tends to absorb water, and therefore, is not suitable for the use as a protective film. Accordingly, as in this embodiment, it is preferable to combine the organic insulating film with a silicon oxide film, a silicon nitride film, or a silicon oxynitride film formed as the first interlayer insulating film 158.

Thereafter, a resist mask having a predetermined pattern is formed by employing a fourth photomask (PM4) to form contact holes that reach the respective impurity regions formed in the island-shaped semiconductor layers so as to function as a source or drain region. These contact holes are formed with a dry etching method. In this case, a mixture gas of $CF_4$, $O_2$, and He is used as an etching gas to first etch away the second interlayer insulating film 159 made of the organic insulating material. The first interlayer insulating film 158 is then etched away with a mixture gas of $CF_4$ and $O_2$ as an etching gas. Furthermore, the etching gas is switched to $CHF_3$ so as to enhance a selection ratio with respect to the island-shaped semiconductor layers, and the gate insulating films 170 having the third shape are etched away, thereby resulting in the contact holes being formed.

Thereafter, a conductive metal film is formed with a sputtering method or a vacuum evaporation method. A resist mask pattern is formed by employing a fifth photomask (PM5), and another etching process is performed to form source wirings 160 to 164 and drain wirings 165 to 168. A pixel electrode 169 can be formed simultaneously with the drain wirings. A pixel electrode 171 represents the one belonging to the adjacent pixel. Although not illustrated, the wirings in this embodiment are formed as follows. A Ti film having a thickness of 50 to 150 nm is formed to be in contact with the impurity regions in the island-shaped semiconductor layers functioning as the source/drain regions. Aluminum (Al) films with a thickness of 300 to 400 nm (in FIG. 6C, designated with reference numerals 160a to 169a) are overlaid on the Ti films, and further transparent conductive films with a thickness of 80 to 120 nm (in FIG. 6C, designated with reference numerals 160b to 169b) are overlaid thereon. As the transparent conductive films, an indium-oxide-zinc-oxide alloy ($In_2O_3$—ZnO) and zinc oxide (ZnO) are also suitable materials. Moreover, zinc oxide having gallium (Ga) added thereto (Zno:Ga) for improving a transmittance of visible lights or an electrical conductivity may be advantageously used.

Thus, by employing five photomasks, a substrate in which the TFT in the driver circuit and the pixel TFT in the pixel portion are formed on the identical substrate can be provided. In the driver circuit, a first p-channel TFT 200, a first n-channel TFT 201, a second p-channel TFT 202, and a second n-channel TFT 203 are formed, while a pixel TFT 204 and a storage capacitance 205 are formed in the pixel portion. In the present specification, such a substrate is referred to as an active matrix substrate for the purpose of convenience.

In the first p-channel TFT 200 in the driver circuit, the conductive layer having the second tapered shape functions as its gate electrode 220. Moreover, the TFT 200 has the structure in which there are provided within the island-shaped semiconductor layer 104, a channel forming region 206, a third impurity region 207a to function as a source or drain region, a fourth impurity region (A) 207b for forming an LDD region not overlapping with the gate electrode 220, and another fourth impurity region (B) 207c for forming an LDD region partially overlapping with the gate electrode 220.

In the first n-channel TFT 201, the conductive layer having the second tapered shape functions as its gate electrode 221. Moreover, the TFT 201 has the structure in which there are provided within the island-shaped semiconductor layer 105, a channel forming region 208, a first impurity region 209a to function as a source or drain region, a second impurity region (A) 209b for forming an LDD region not overlapping with the gate electrode 221, and another second impurity region (B) 209c for forming an LDD region partially overlapping with the gate electrode 221. A channel length is set in the range from 2 to 7 μm, while an overlapping length of the second impurity region (B) 209c with the gate electrode 221 is set in the range from 0.1 to 0.3 μm. This overlapping length Lov is controlled through the thickness of the gate electrode 221 as well as an angle of the tapered portion. By forming such an LDD region in the n-channel TFT, a high electrical field to be otherwise generated in the vicinity of the drain region can be mitigated, so that hot carriers are prevented from being generated, thereby resulting in prevention of deterioration of the TFT.

The second p-channel TFT 202 in the driver circuit similarly has the conductive layer having the second tapered shape, which functions as its gate electrode 222. Moreover, the TFT 202 has the structure in which there are provided within the island-shaped semiconductor layer 106, a channel forming region 210, a third impurity region 211a to function as a source or drain region, a fourth impurity region (A) 211b for forming an LDD region not overlapping with the gate electrode 222, and another fourth impurity region (B) 211c for forming an LDD region partially overlapping with the gate electrode 222.

The second n-channel TFT 203 in the driver circuit has the conductive layer having the second tapered shape which functions as its gate electrode 223. Moreover, the TFT 203 has the structure in which there are provided within the island-shaped semiconductor layer 107, a channel forming region 212, a first impurity region 213a to function as a source or drain region, a second impurity region (A) 213b for forming an LDD region not overlapping with the gate electrode 223, and another second impurity region (B) 213c for forming an LDD region partially overlapping with the gate electrode 223. Similarly with the second n-channel TFT 201, an overlapping length of the second impurity region (B) 213c with the gate electrode 223 is set in the range from 0.1 to 0.3 μm.

The driver circuit is composed of logic circuits such as a shift register circuit, a buffer circuit or the like, as well as a sampling circuit formed of an analog switch, or the like. In FIG. 6B, the TFTs for forming these circuits are illustrated to have a single-gate structure in which only one gate electrode is provided between a pair of source and drain regions. However, a multigate structure in which a plurality of gate electrodes are provided between a pair of source and drain regions may also be used.

The pixel TFT 204 has the conductive layer having the second tapered shape which functions as its gate electrode 224. Moreover, the pixel TFT 204 has the structure in which there are provided within the island-shaped semiconductor layer 108, channel forming regions 214a and 214b, first impurity regions 215a and 217 to function as source or drain regions, a second impurity region (A) 215b for forming an LDD region not overlapping with the gate electrode 224, and another second impurity region (B) 215c for forming an LDD region partially overlapping with the gate electrode 224. An overlapping length of the second impurity region (B) 213c with the gate electrode 224 is set in the range from 0.1 to 0.3 μm. In addition, a storage capacitor is formed from a semiconductor layer extending from the first impurity region 217 and including a second impurity region (A) 219b, another second impurity region (B) 219c, and a region 218 into which no impurity elements for defining the conductivity type are added; an insulating layer formed on the same level as the gate insulating film having the third shape; and a conductive layer having the second tapered shaped.

Figure 12:
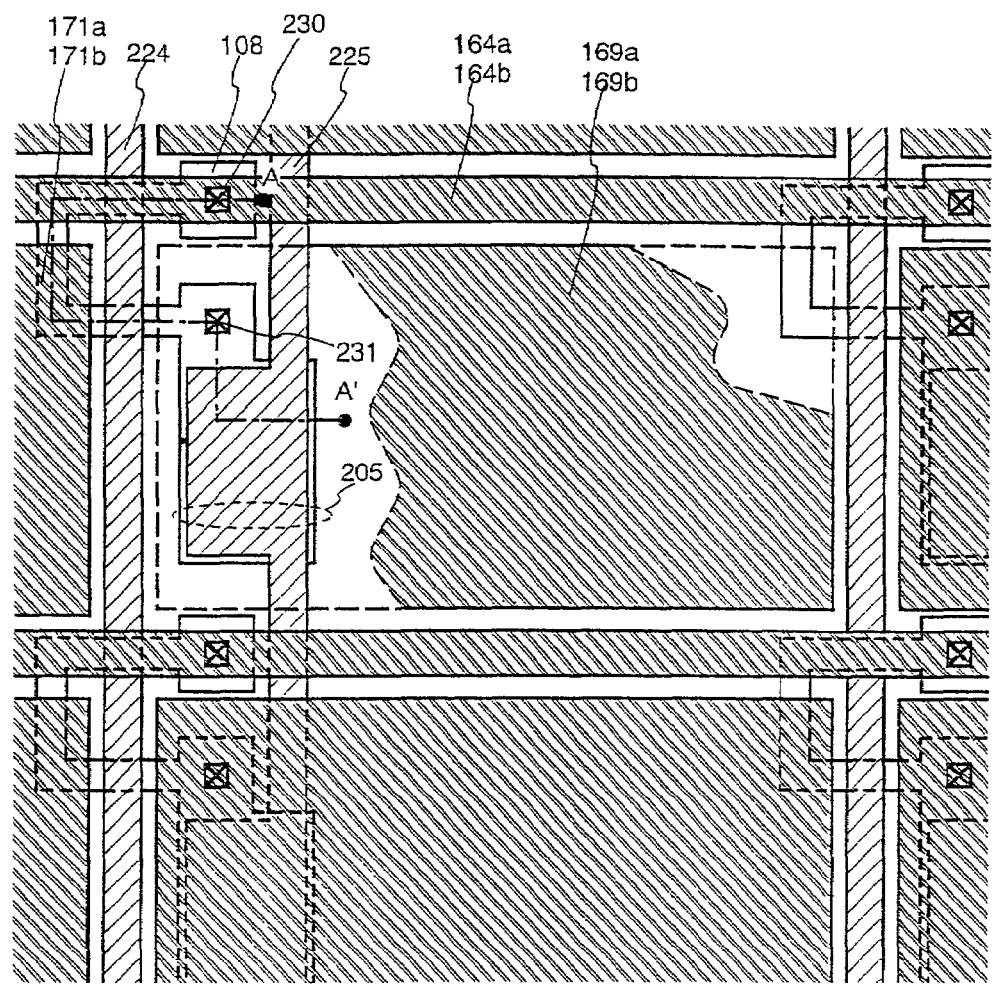
FIG. 12 shows a top view of a pixel.

FIG. 12 shows a top view illustrating substantially the whole area corresponding to one pixel in the pixel portion. The cross-sectional view of the pixel portion shown in FIG. 6B is taken along the line A–A' indicated in FIG. 12. The gate electrode 224 crosses the underlying island-shaped semiconductor layer 108 via a gate insulating film (not illustrated), and further extends over a plurality of the island-shaped semiconductor layers so as to also function as the gate wiring. Although not illustrated, in the island-shaped semiconductor layer, the source region, the drain region, and the LDD region, as described with reference to FIG. 6B, are provided. In addition, reference numeral 230 designates a contact portion between a source wiring 164 and the source region 227, while 231 designates a contact portion between the pixel electrode 169 and the drain region 227. The retaining capacitance 205 is formed in the region in which a semiconductor layer extending from the drain region 227 of the pixel TFT 204 overlaps with a capacitance wiring 225 via the gate insulating layer. In the above structure, no impurity elements intended for controlling valence electrons are added into the semiconductor layer 218.

The above-described structure allows the structures of the respective TFTs to be optimized based on requirements required in the pixel TFT and the driver circuit, and further allows the operating performances and the reliability of the semiconductor device to be improved. Moreover, by forming a gate electrode with a conductive material having the sufficient heat-resistance capability, activation of the LDD region or the source/drain regions can be easily performed. Furthermore, by forming the LDD region with a gradient in the concentration of impurity elements added for the purpose of controlling the conductivity type when forming the LDD region overlapping with the gate electrode via the gate insulating film, an effect of mitigating an electrical field, especially in the vicinity of the drain region, can be expected to be enhanced.

Figure 10A:
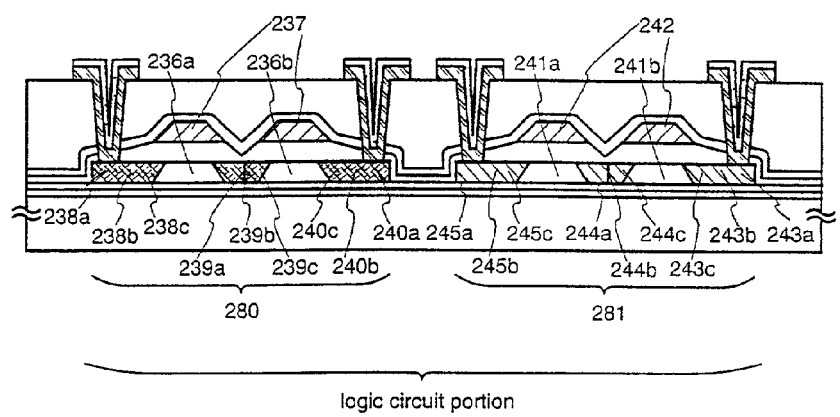
FIGS. 10A and 10B respectively show cross-sectional structures of an active matrix substrate in accordance with Embodiment 1 of the present invention.

In the case of the active matrix liquid crystal display device, the first p-channel TFT 200 and the first n-channel TFT 201 are used for forming circuits required to operate at a high speed, such as a shift register circuit, a buffer circuit, or a level shifter circuit. In FIG. 6B, these circuits are expressed as a logic circuit portion. The second impurity region (B) 20c of the first n-channel TFT 201 has a structure in which the countermeasure against hot carriers is emphasized. Moreover, in order to improve breakdown characteristics and stabilize operations, the TFT in the logic circuit portion may be formed of the first p-channel TFT 280 and the first n-channel TFT 281, as shown in FIG. 10A. This TFT has a double-gate structure in which two gate electrodes are provided between a pair of source/drain regions, and can be similarly fabricated in accordance with the fabrication process in the present embodiment. The first p-channel TFT 280 has in the island-shaped semiconductor layer, channel forming regions 236a and 236b, third impurity regions 238a, 239a, 240a to function as source or drain regions, fourth impurity regions (A) 238b, 239b, 240b for forming LDD regions, and other fourth impurity regions (B) 238c, 239c, 240c for partially overlapping with the gate electrode 237 to form LDD regions. The first n-channel TFT 281 has in the island-shaped semiconductor layer, channel forming regions 241a and 241b, first impurity regions 243a, 244a, 245a to function as source or drain regions, second impurity regions (A) 243b, 244b, 245b for forming LDD regions, and other second impurity regions (B) 243c, 244c, 245c for forming LDD regions partially overlapping with the gate electrode 242. A channel length is set on the range from 3 to 7 μm, and an overlapping length Lov in the channel length direction of the LDD region overlapping with the gate electrode is set in the range from 0.1 to 0.3 μm.

Figure 10B:
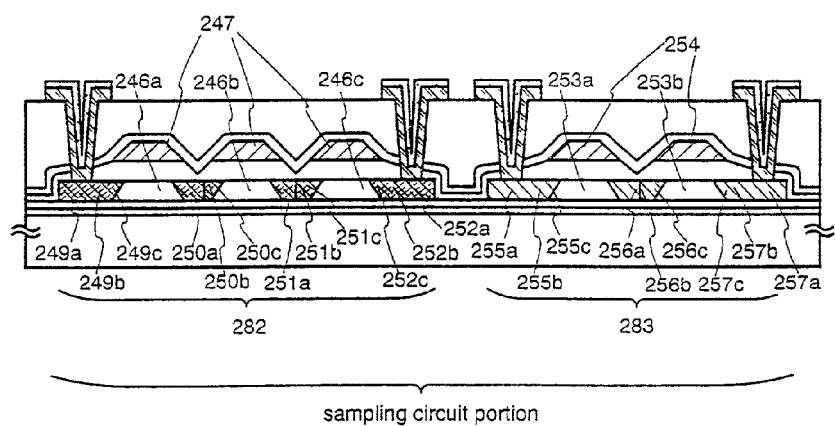

In the sampling circuit composed of the analog switches, the second p-channel TFT 202 and the second n-channel TFT 203 having the similar structures can be applied. Since the countermeasure against hot carriers, as well as realization of a low OFF current operation, are important for the sampling circuit, these TFTs in the sampling circuit may be formed of the second p-channel TFT 282 and the second n-channel TFT 283, as shown in FIG. 10B. The second p-channel TFT 282 has a triple-gate structure in which three gate electrodes are provided between a pair of source/drain regions, and can be similarly fabricated in accordance with the fabrication process in the present embodiment. The second p-channel TFT 282 has in the island-shaped semiconductor layer, channel forming regions 246a, 246b, and 246c, third impurity regions 249a, 250a, 251a, and 252a to function as source or drain regions, fourth impurity regions (A) 249b, 250b, 251b, and 252b for forming LDD regions, and other fourth impurity regions (B) 249c, 250c, 251c, and 252c for partially overlapping with the gate electrode 247 to form LDD regions. The second n-channel TFT 283 has in the island-shaped semiconductor layer, channel forming regions 253a and 253b, first impurity regions 255a, 256a, 257a to function as source or drain regions, second impurity regions (A) 255b, 256b, 257b for forming LDD regions, and other second impurity regions (B) 255c, 256c, 257c for partially overlapping with the gate electrode 254 to form LDD regions. A channel length is set in the range from 3 to 7 μm, and an overlapping length Lov in the channel length direction of the LDD region overlapping with the gate electrode is set in the range from 0.1 to 0.3 μm.

Thus, whether the gate electrode of the TFT should be a single-gate structure or a multigate structure in which a plurality of gate electrodes are provided between a pair of source/drain regions, may be appropriately selected depending on the required characteristics of the circuit. By employing the active matrix substrate completed in accordance with the present embodiment, a reflection-type liquid crystal display device can be fabricated.

Embodiment 2

In Embodiment 1, heat-resistive conductive materials such as W or Ta are used for forming the gate electrode. The reason why those materials are used is as follows. The impurity elements added into the semiconductor layer for the purpose of controlling the conductivity type after forming the gate electrode are required to be activated through the thermal annealing at the temperature of 400 to 700° C. Accordingly, the gate electrode is required to have sufficient heat-resisting capability. However, such heat-resistive conductive materials have a large area resistance of about 10 Ω, and therefore, are not necessarily suitable for display devices having a display size of the 4-inch class or more. When a gate line to be connected to the gate electrode is formed of the same material, a line length extending on the substrate is inevitably lengthened. Thus, the disadvantage of wiring delays due to the adverse influence of wiring resistance cannot be ignored.

Figure 7A:
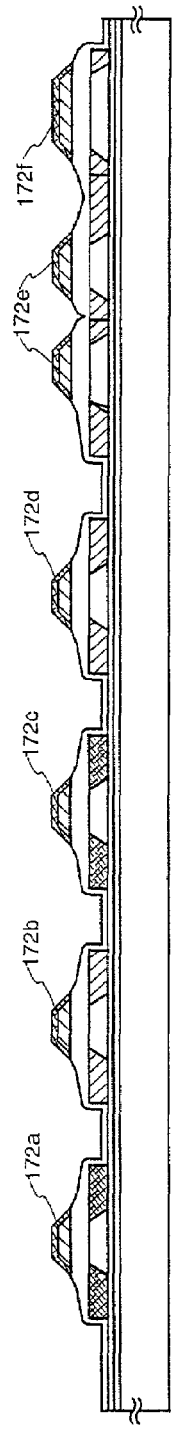
FIGS. 7A through 7C respectively show fabrication steps for an active matrix substrate in accordance with Embodiment 2 of the present invention.

For example, in the case where the pixel density is of the VGA, 480 gate wirings and 640 source lines are to be formed, while in the case where the pixel density is of the XGA, 768 gate wirings and 1024 source lines are to be formed. With respect to the size of the display region, the diagonal length in the case of the 13-inch class is 340 mm, while the diagonal length in the 18-inch class is 460 mm. In the present embodiment, in order to realize such a liquid crystal display device, a method for forming the gate wirings with a low-resistance conductive material such as aluminum (Al) or copper (Cu) will be described with reference to FIGS. 7A through 7C.

First, the process steps as shown in FIGS. 4A through 4D and 5A through 5C are performed as in Embodiment 1. Then, a process for activating the impurity elements added into the respective island-shaped semiconductor layers for controlling the conductivity types is performed. This process is realized by a thermal annealing method which employs a furnace anneal oven. Alternatively, a laser annealing method, or a rapid thermal annealing method (RTA method) may be applied for that purpose. The thermal annealing is performed within a nitrogen atmosphere having the oxygen concentration of 1 ppm or lower, preferably 0.1 ppm or lower, at 400 to 700° C., typically 500 to 600° C. In the present embodiment, the thermal annealing is performed at 500° C. for 4 hours.

Applying this heat treatment, a depth of 5 to 80 nm from the surfaces of the conductive layers 140 to 145 having the second tapered shape become conductive layers (C) 172a to 172f. For example, in the case where the conductive layers having the second tapered shape are made of W, tungsten nitride is formed, while tantalum nitride is formed for the case of Ta. Furthermore, a heat treatment is performed in the atmosphere containing hydrogens at the concentration of 3 to 100% at 300 to 450° C. for 1 to 12 hours so that the island-shaped semiconductor layers are hydrogenated. In this process, dangling bonds existing in the island-shaped semiconductor layers are terminated with thermally excited hydrogens. As another means for the hydrogenation, plasma hydrogenation (in which hydrogens excited by means of plasma are employed) may be performed (see FIG. 7A).

After the activation process and the hydrogenation process, gate lines are formed of a low-resistance conductive material. The low-resistance conductive material includes aluminum (Al) or cupper (Cu) as the main component, and the gate lines are formed of a low-resistance conductive layer made of such materials. For example, an Al film containing Ti of 0.1 to 2 wt % (not illustrated) as the low-resistance conductive layer is formed on the entire surface. The low-resistance conductive layer is formed to have a thickness in the range of 200 to 400 nm (preferably 250 to 350 nm). A predetermined resist pattern is then formed to perform the etching process, thereby forming the gate lines 173 and 174. In this step, a capacitance line 175 for connecting to a storage capacitor to provided in the pixel portion is also formed of the same material. In the case where the low-resistance conductive layer is formed of a material containing Al as its main component, a wet etching is performed as the etching process by means of a etching solution of phosphoric acid type, so that the gate lines can be formed while maintaining sufficient selective workability. The first interlayer insulating film 176 is formed in the same manner as in Embodiment 1 (see FIG. 7B).

Figure 7C:
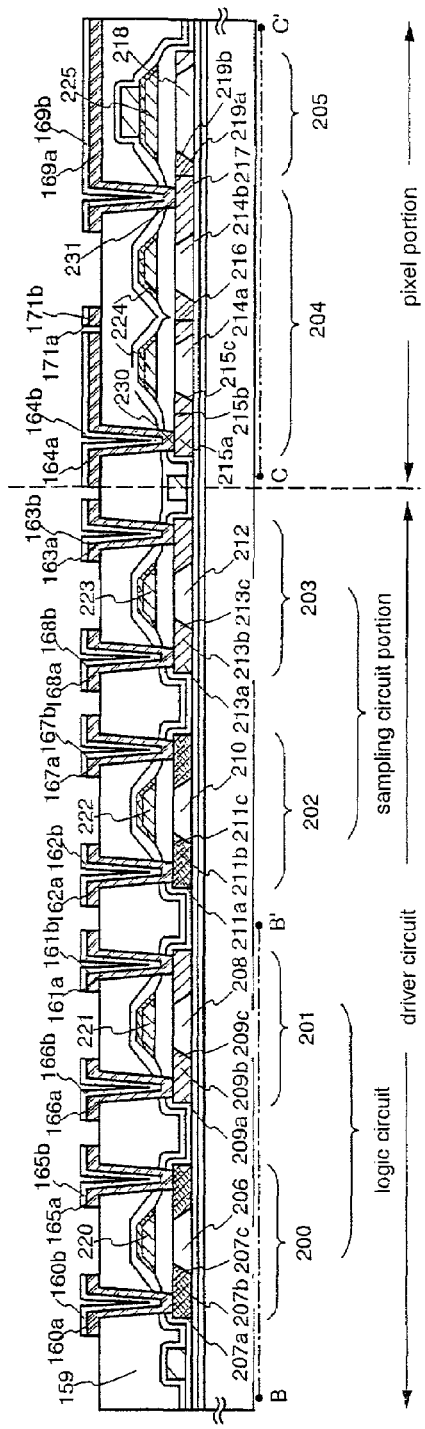
Figure 8A:
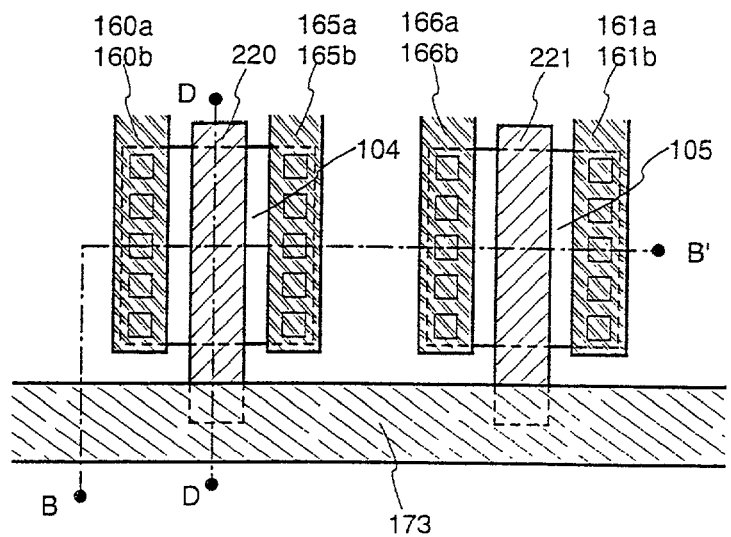
FIGS. 8A and 8B respectively show top views in the fabrication steps for an active matrix substrate.
Figure 8B:
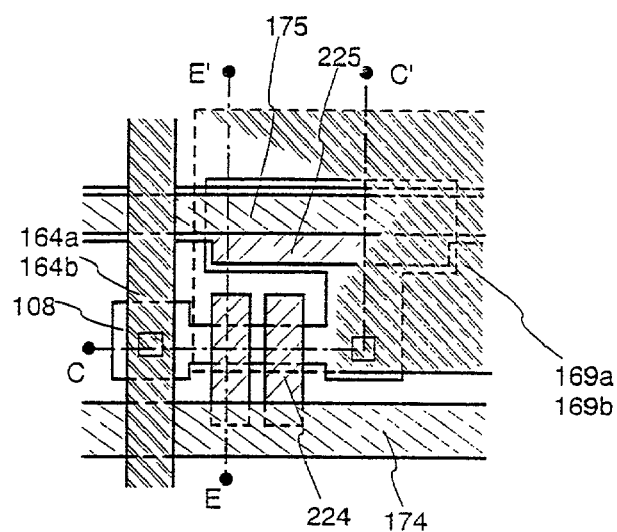
Figure 9A:
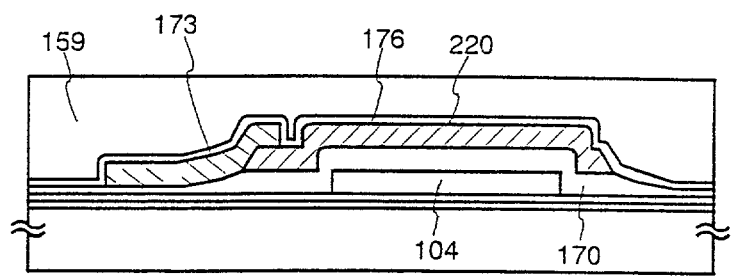
FIGS. 9A and 9B respectively show cross-sectional structures in the fabrication steps for an active matrix substrate.
Figure 9B:
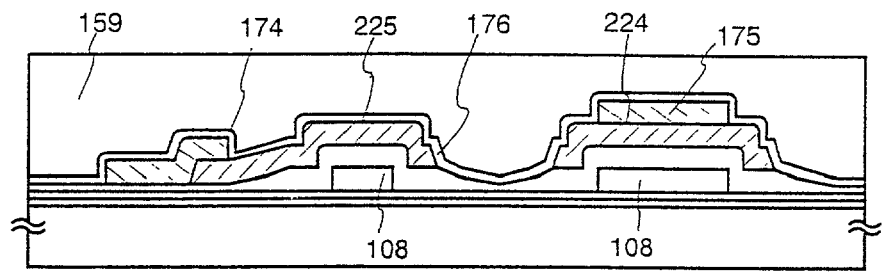

Thereafter, the second interlayer insulating film 159 made of an organic insulating material, the source lines 160 to 164, the drain lines 165 to 168, and the pixel electrodes 169 and 171 are formed in the similar manner as in Embodiment 1, thereby completing the active matrix substrate. FIGS. 8A and 8B respectively show top views in such conditions. The B–B' cross-section and the C–C' cross-section in FIGS. 8A and 8B respectively correspond to B–B' and C–C' in FIGS. 7C and 8B. Although the gate insulating film, the first interlayer insulating film, and the second interlayer insulating film are omitted in FIGS. 8A and 8B, the source lines 160, 161, and 164, the drain lines 165, and 166 as well as the pixel electrode 169 are connected to the source and drain region (not illustrated) in the island-shaped semiconductor layers 104, 105 and 108 via contact holes. Furthermore, the D–D' cross-section in FIG. 8A is shown in FIG. 9A, while the E–E' cross-section in FIG. 8B is shown in FIG. 9B. The gate lines 173 and 174 are formed so as to overlap with the gate electrodes 220 and 225, respectively, in the outer side of the island-shaped semiconductor layers 104 and 108. The gate electrode and the low-resistance conductive layer are electrically connected to each other without interposing any contact hole therebetween. By thus forming the gate line with the low-resistance conductive material, the wiring resistance can be sufficiently reduced. Accordingly, the above embodiment can be applied to a display device having a pixel portion (screen size) of the 4-inch class or larger.

Embodiment 3

The active matrix substrate can be applied to a reflection-type display device without significant modification. On the other hand, when a transparent-type liquid crystal display device is to be fabricated, the pixel electrode to be provided in each of the pixels in the pixel portion is formed by employing a transparent electrode. In the present embodiment, a method of manufacturing the active matrix substrate for the transparent-type liquid crystal display device will be described with reference to FIGS. 11A through 11D.

Figure 11A:
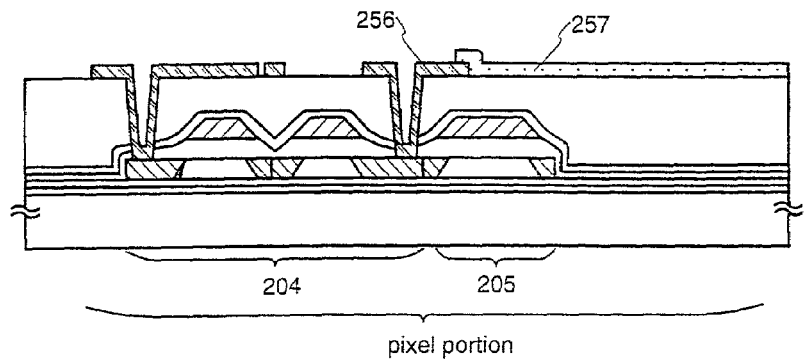
FIGS. 11A through 11D respectively show cross-sectional structures of an active matrix substrate.
Figure 11B:
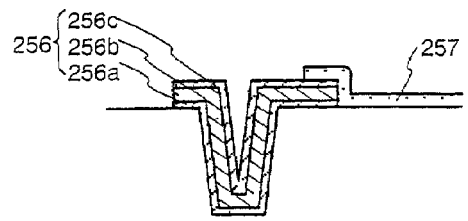

An active matrix substrate is formed in the manner similar to Embodiment 1. In FIG. 11A, the source wirings and the drain wirings are provided by forming a conductive metal film with a sputtering method or a vacuum deposition method. The structure will be described with reference to FIG. 11B in detail by taking the drain wirings 256 as an example. A Ti film 256a having a thickness of 50 to 150 nm is formed to be in contact with the semiconductor film in the island-shaped semiconductor layers functioning as the source and drain regions. An aluminum (Al) film 256b with a thickness of 300 to 400 nm is overlaid on the Ti film 256a, and further a Ti film 256c or a titanium nitride (TiN) film with a thickness of 100 to 200 nm is overlaid thereon, thereby resulting in a three-layered structure. Thereafter, a transparent conductive film is formed on the entire surface, and the pixel electrode 257 is formed through the patterning process with a photomask and an etching process. The pixel electrode 257 is formed on the second interlayer insulating film made of an organic resin material, and a portion overlapping with the drain line 256 of the pixel TFT 204 without any contact hole interposed therebetween is formed to provide electrical connection.

Figure 11C:
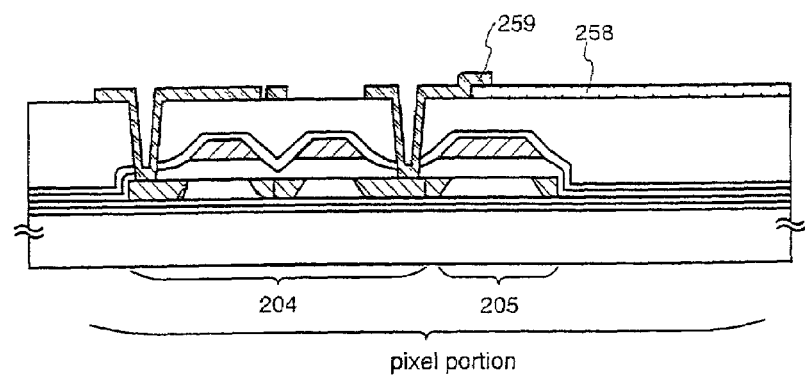
Figure 11D:
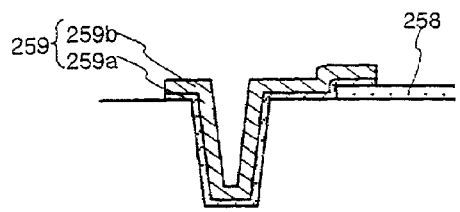

In FIG. 11C, a transparent conductive film is first formed on the second interlayer insulating film, and the pixel electrode 258 is formed through the patterning process and an etching process. Thereafter, the drain line 259 is connected to the pixel electrode 258 without interposing any contact hole therebetween. For forming the drain line 259, as shown in FIG. 11D, a Ti film 259a having a thickness of 50 to 150 nm is formed to be in contact with the semiconductor film in the island-shaped semiconductor layers functioning as the source/drain regions. An aluminum (Al) film 259b with a thickness of 300 to 400 nm is overlaid on the Ti film 259a. With this configuration, the pixel electrode 258 is in contact only with the Ti film 259a forming the drain wiring 259. As a result, direct contact and reaction between the transparent conductive material and Al can be surely prevented.

As the material for the transparent conductive film, indium oxide ($In_2O_3$), and indium-oxide-tin-oxide alloy ($In_2O_3$—$SnO_2$; ITO) or the like can be formed with a sputtering method, a vacuum deposition method, or the like. An etching process for such materials is performed by employing an etching solution of hydrochloric acid type. However, since the etching process for ITO is likely to generate residue, an indium-oxide-zinc-oxide alloy ($In_2O_3$—ZnO) nay be used. Since the indium-oxide-zinc-oxide alloy can exhibit satisfactory surface planarization characteristics, as well as better thermal stability as compared to ITO, the Al film 256b can be prevented from being in contact with the pixel electrode 257 at the end surface of the drain wiring 256 in the structure shown in FIGS. 11A and 11B, thereby preventing a corrosive reaction from occurring. Similarly, zinc oxide (ZnO) are also suitable materials. Moreover, zinc oxide having gallium (Ga) added thereto for improving a transmittance of visible lights or an electrical conductivity may be advantageously used.

In Embodiment 1, the active matrix substrate capable of being used for fabricating a reflection-type liquid crystal display device can be obtained by employing five photomasks. In the present embodiment, on the other hand, the active matrix substrate to be used for fabricating a transparent-type liquid crystal display device can be obtained with one additional photomask (i.e., by employing a total of six photomasks). Although it has been described in the present embodiment to perform the similar process steps as in Embodiment 1, such a structure can be applied to the active matrix substrate as shown in Embodiment 2.

Embodiment 4

In the present embodiment, another fabrication method of a crystalline semiconductor layer to be used for forming an active layer of a TFT in the active matrix substrate as shown in Embodiments 1 through 3 will be described. The crystalline semiconductor layer can be formed through crystallization by a thermal annealing method, a laser annealing method, an RTA method, or the like. Alternatively, a crystallization method employing catalytic elements as disclosed in Japanese Patent Application Laid-Open No. Hei 7-130652 can be also applied. The example in this case will be described with reference to FIGS. 13A through 13C.

Figure 13:
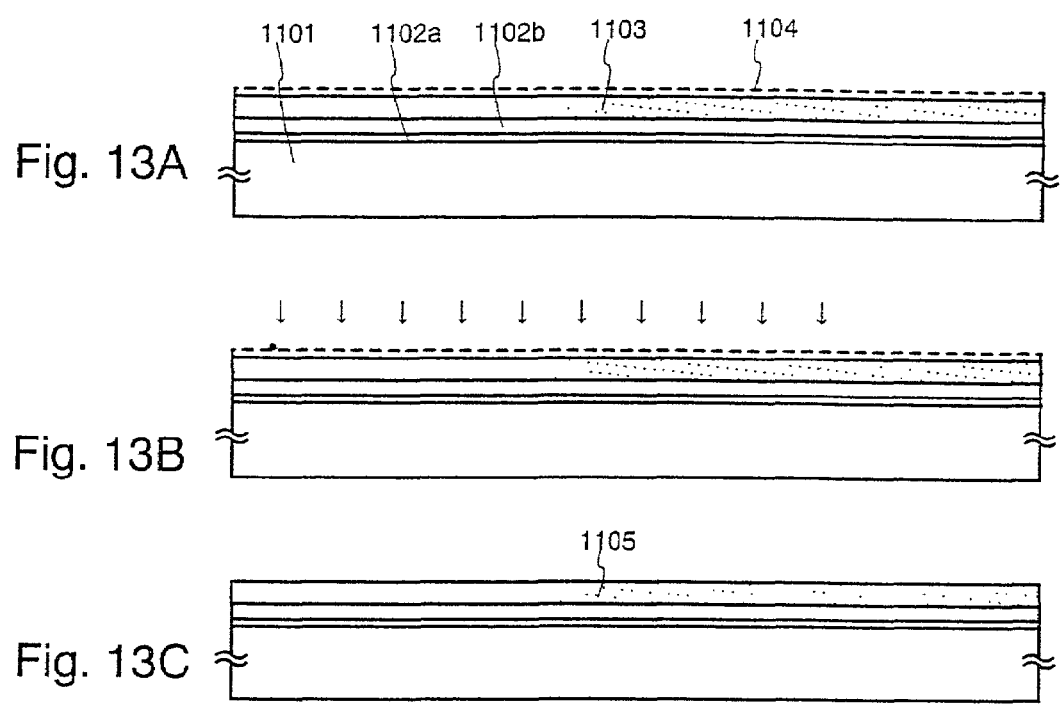
FIGS. 13A through 13C respectively show fabrication steps for an active matrix substrate.

As shown in FIG. 13A, underlying layers 1102a and 1102b as well as a semiconductor layer 1103 having an amorphous structure with a thickness of 25 to 80 nm are formed on a glass substrate 1101, as in the similar manner with Embodiment 1. The amorphous semiconductor layer can be an amorphous silicon (a-Si) film, an amorphous silicon germanium (a-SiGe) film, an amorphous silicon carbide (a-SiC) film, an amorphous silicon tin (a-SiSn) film or the like. It is preferable to form these amorphous semiconductor films to have hydrogens at about 0.1 to 40 atomic %. For example, an amorphous silicon film is formed to have a thickness of 55 nm. Then, a solution containing catalytic elements of 10 ppm (calculated in terms of weight) is applied with a spin coating method in which the substrate is rotated by a spinner, so that a layer 1104 containing the catalytic elements is formed. As the catalytic elements, nickel (Ni), germanium (Ge), iron (Fe), palladium (Pd), tin (Sn), lead (Pb), cobalt (Co), platinum (Pt), copper (Cu), gold (Au) or the like can be used. The layer 1104 containing the catalytic elements may be formed, instead of the spin coating method, with a printing method, a spray method, a bar coater method, or a sputtering method, and a vacuum deposition method to have a thickness of 1 to 5 nm.

Then, in the process step of crystallization as shown in FIG. 13B, a heat treatment at 400 to 500° C. is performed for about one hour, so that the amount of hydrogens contained in the amorphous silicon film is reduced to 5 atom % or lower. When the amount of hydrogens contained in the amorphous silicon film the same as this level when first deposited after film formation, heat treatment is not necessarily required to be performed. Then, a thermal annealing is performed in a nitrogen atmosphere with a furnace annealing oven at 550 to 600° C. for 1 to 8 hours. From the above-mentioned process, a crystalline semiconductor layer 1105 made of crystalline silicon film can be obtained (see FIG. 13C). However, the crystalline semiconductor layer 1105 thus formed through the thermal annealing may be observed to contain local amorphous regions remaining therein when macroscopically observed with an optical microscope. In such a case, an amorphous component having a broad peak at 480 $cm^{-1}$ can be similarly observed with a Raman spectroscopy. Accordingly, enhancement of crystallinity by processing the crystalline semiconductor layer 1105 with the laser annealing method after the thermal annealing as described in Embodiment 1 can be applied as effective means.

Figure 17A:
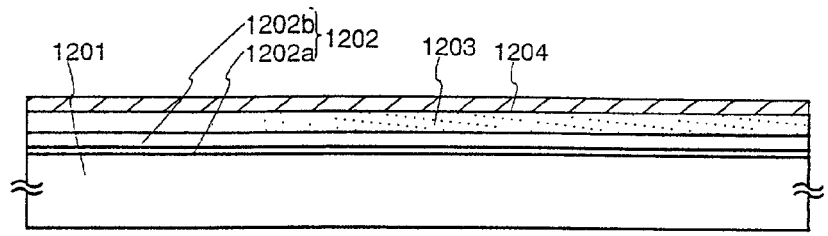
FIGS. 17A through 17C respectively show fabrication steps for an active matrix substrate.
Figure 17B:
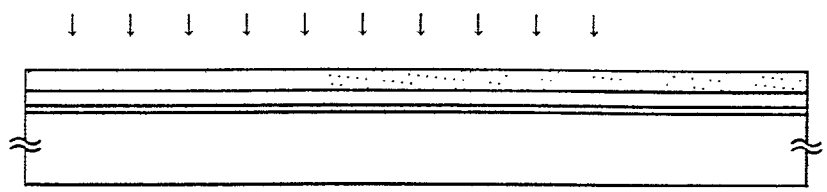
Figure 17C:
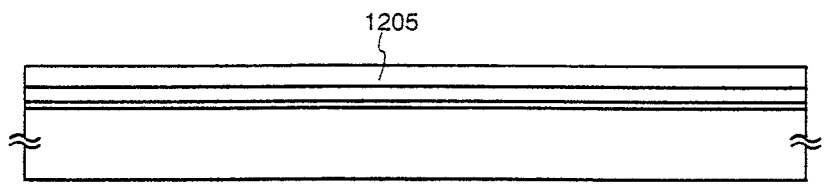

Another embodiment of the crystallization method which employs catalytic elements is shown in FIGS. 17A through 17C, in which a layer containing catalytic elements is formed with a sputtering method. First, as in Embodiment 1, underlying layers 1202a and 1202b as well as a semiconductor layer 1203 with a thickness of 25 to 80 nm having an amorphous structure are formed on a glass substrate 1201. An oxide film (not illustrated) having a thickness of about 0.5 to 5 nm is then formed on the surface of the semiconductor layer 1203 having the amorphous structure. The oxide film having such a thickness can be formed with the plasma CVD method or the sputtering method. Alternatively, the film may be formed by heating the substrate at 100 to 300° C. and exposing the surface of the semiconductor layer 1203 having the amorphous structure to a plasmarized oxygen atmosphere, or by exposing the surface of the semiconductor layer 1203 having the amorphous structure to a solution containing hydrogen peroxide solution ($H_2O_2$). Alternatively, the film may be formed by exposing the semiconductor layer 1203 having the amorphous structure to ozone atmosphere generated by irradiating an atmosphere containing oxygens with ultraviolet rays.

On the semiconductor layer 1203 having an amorphous structure and a thin oxide film on its surface, a layer 1204 containing the catalytic elements is formed with a sputtering method. Although a thickness of the layer 1204 is not limited to any specific range, it may be formed to have a thickness of about 10 to 100 nm. For example, it is effective to form an Ni film by employing an Ni target. In the sputtering method, a portion of high energy particles composed of the catalytic elements accelerated by means of an electrical field travel also to the substrate side to be implanted in the vicinity of the surface of the semiconductor layer 1203 having an amorphous structure or into the oxide film formed on the surface of the semiconductor layer 1203. Although the ratio of the thus implanted particles is varied depending on a plasma generation condition or a substrate biasing condition, it is preferable to set the amount of the catalytic elements implanted into the vicinity of the surface of the semiconductor layer 1203 having an amorphous structure or into the oxide film formed on the layer 1203 in the range from about $1 \times 10^{11}$ to $1 \times 10^{14}$ atoms/cm$^2$.

Thereafter, the layer 1204 containing the catalytic elements is selectively removed. For example, when the layer is made of a Ni film, it is possible to remove the layer by a solution such as nitric acid. Alternatively, with a process employing a solution containing hydrofluoric acid, the Ni film and the oxide film formed on the semiconductor layer 1203 having the amorphous structure can be simultaneously removed. In either case, the amount of catalytic elements contained in the vicinity of the surface of the semiconductor layer 1203 having the amorphous structure is set in the range from about $1 \times 10^{11}$ to $1 \times 10^{14}$ atoms/cm$^2$. Then, the crystallization process through a thermal annealing process similarly in FIG. 13B is performed as in FIG. 17B, thereby resulting in the crystalline semiconductor layer 1205 being obtained (see FIG. 17C).

By forming the island-shaped semiconductor layers 104 to 108 from the crystalline semiconductor layers 1105 or 1205 thus formed in the process shown in FIGS. 13A through 13C or the process shown in FIGS. 17A through 17C, the active matrix substrate can be completed as in Embodiment 1. However, when the catalytic elements for assisting the crystallization of silicon during the crystallization process are used, a minute amount (about $1 \times 10^{17}$ to $1 \times 10^{19}$ atoms/cm$^3$) of the catalytic elements remain in the island-shaped semiconductor layers. Although it is possible to complete a TFT even under such a condition, it is more preferable to remove the remaining catalytic elements, at least from the channel forming region. One of means for removing the catalytic elements includes the use of gettering function by phosphorus (P).

Figure 14:
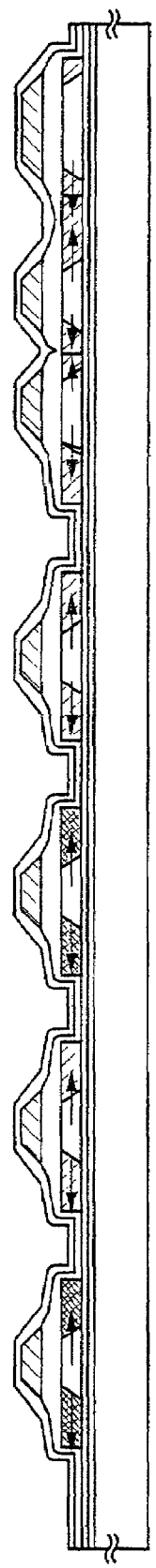
FIG. 14 shows a fabrication step for an active matrix substrate.

In the gettering process by means of phosphorus (P) for the above-described purpose, the activation process as described with reference to FIG. 6A can be simultaneously performed. The process will be described with reference to FIG. 14. The concentration of phosphorus (P) required for gettering is substantially the same level as the impurity concentration in the high-concentration n-type impurity region. By the thermal annealing in the activation process, the catalytic elements can be segregated from the channel forming region of the n-channel type or p-channel TFT toward the impurity region containing phosphorus (P) at the above concentration (along the direction indicated by the arrow in FIG. 14). As a result, the catalytic elements at the concentration about $1 \times 10^{17}$ to $1 \times 10^{19}$ atoms/cm$^3$ can be segregated in the impurity region. The TFT thus formed exhibits a reduced OFF current value as well as satisfactory crystallinity which leads to a higher field effect mobility, thereby satisfactory operating TFT characteristics may be obtained.

Embodiment 5

Figure 15:
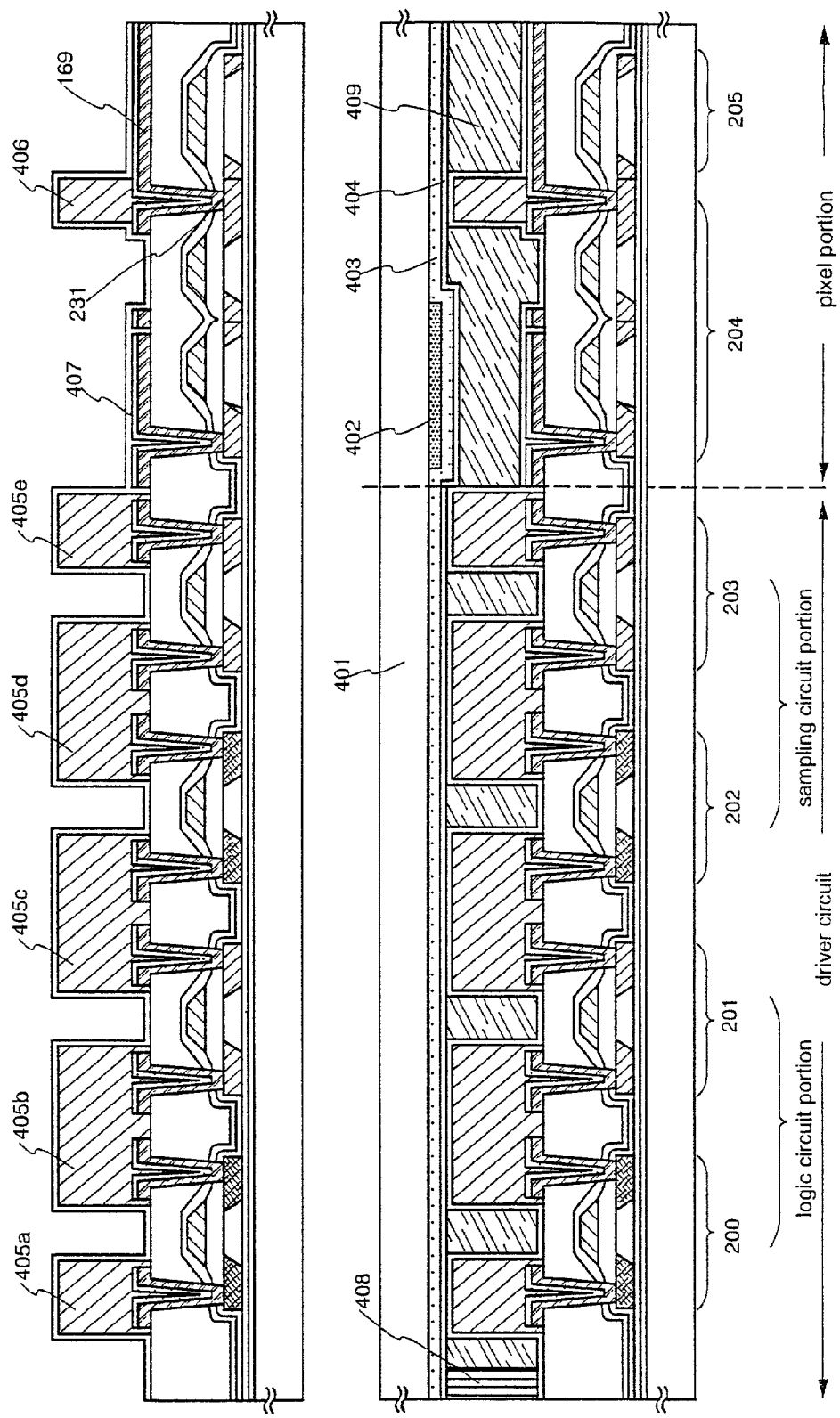
FIG. 15 shows a cross-sectional structure of an active matrix liquid crystal display device.

In the present embodiment, a process for fabricating an active matrix liquid crystal display device from the active matrix substrate provided in Embodiment 1 will be described. First, as shown in FIG. 15A, spacers made of column-shaped spacers are formed on the active matrix substrate shown in FIG. 6B. Although the spacers may be formed by scattering particles having the size of several μm, the spacers in the present embodiment are provided by forming a resin film on the entire surface of the substrate and then patterning the resin film. Although a material for the spacers is not limited to any specific one, for example, NN700 available from JSR may be employed. After applied by a spinner, the NN700 is processed into a predetermined pattern through exposure and development processes. Furthermore, the material is hardened by heating at 150 to 200° C. by means of a clean oven or the like. The thus formed spacers can have different shapes depending on the exposure and development conditions. Preferably, the spacers are formed to have a column-like shape with a flat top portion. Such a shape provides a sufficient mechanical strength for a liquid crystal display panel when the counter substrate is fitted. The spacers may be in the shape of a cone or a rectangular cone. More specifically, in the case of a conical shape, a height is set in the range from 1.2 to 5 μm, an average radium is in the range from 5 to 7 μm, and a ratio of the average radius to a radius of the bottom surface is set at 1:1.5. A taper angle for the side surface is set to be =15 degrees or smaller at this time.

The arrangement for the spacers may be arbitrarily determined. Preferably, in the pixel portion, as shown in FIG. 15A, a column-shaped spacer 406 is formed to overlap with the contact portion 231 of the pixel electrode 169 and cover a portion thereof. The contact portion 231 does not have flatness, and liquid crystal molecules cannot be properly oriented. Accordingly, by forming the column-shaped spacer 406 so as to fill the contact portion 231 with the resin for spacers, disadvantages such as desclination can be prevented. In addition, spacers 405a to 405e are also formed above the TFTs in the driver circuit. These spacers may be formed over the entire driver circuit portion. Alternatively, the spacers may be provided so as to cover the source lines and the drain lines as shown in FIGS. 15A and 15B.

An orientation film 407 is then formed. A polyimide resin is usually used as an orientation film for liquid crystal display element. After forming the orientation film, a rubbing process is performed so that the liquid crystal molecules are oriented at a certain pretilt angle. In the rubbing process, the size of regions not rubbed is set to be 2 μm or smaller in the rubbing direction from the end portion of the column-shaped spacer 406 provided in the pixel portion. In addition, although disadvantages involving static discharge are often introduced in the rubbing process, the spacers 405a to 405e provided over the TFTs in the driver circuit can provide an effect of protecting the TFTs from static electricity. In addition, although not illustrated, it is also possible to first provide the orientation film 407 and then form the spacers 406 and 405a to 406e.

On a counter substrate 401, a light shielding film 402, a transparent conductive film 403, and an orientation film 404 are formed. As the light shielding film 402, a Ti film, a Cr film, an Al film or the like is formed to have a thickness of 150 to 300 nm. Then, the active matrix substrate provided with the pixel portion and the driver circuit thereon, and the counter substrate are adhered to each other by means of a sealing agent 408. Fillers (not illustrated) are mixed into the sealing agent 408, and the fillers and the spacers 406 and 405a to 405e allow the two substrates to be adhered to each other with a uniform distance. Thereafter, liquid crystal material 409 is injected between the two substrates. Any known liquid crystal material can be used for that purpose. For example, not only a TN liquid crystal, non-threshold antiferroelectric mixed liquid crystal exhibiting an electro-optical response in which the transmittance continuously changes in accordance with an electrical field can be used. Some of the non-threshold antiferroelectric mixed liquid crystals shows the V-shaped electro-optical response. Thus, the active matrix liquid crystal display device is completed.

The column-shaped spacers 406 as shown in FIGS. 15A and 15B may be provided for all of the respective pixels. Alternatively, the spacer may be provided for every several to several tens of pixels arranged in matrix. More specifically, the ratio of the number of the spacers against the total number of pixels constituting the pixel portion can be set to be in the range from 20 to 100%. Moreover, the spacers 405a to 405e provided in the driver circuit portion may be formed so as to cover the entire surface. Alternatively, the spacers may be provided at positions corresponding to the source and drain wirings of the respective TFTs.

Figure 16:
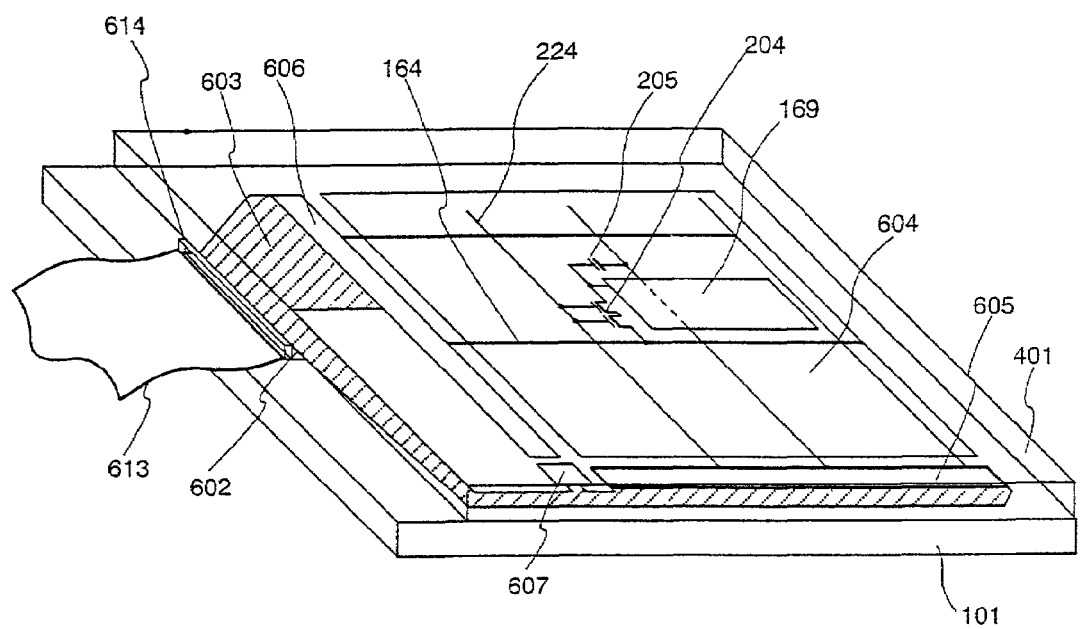
FIG. 16 shows an appearance of an AM-LCD.

The structure of the active matrix liquid crystal display device will be described with reference to a perspective view of FIG. 16. In FIG. 16, the active matrix substrate is composed of a pixel portion 604, a scanning signal driver circuit 605, an image signal driver circuit 606, and other signal processing circuit 607 provided on a glass substrate 101. The pixel portion 604 is provided with the pixel TFTs 204 and the retaining capacitances 205, while the driver circuit disposed in the periphery of the pixel portion is basically composed of CMOS circuits. The gate lines (corresponding to reference numeral 224 in FIG. 6B when formed continuously with the gate electrode) and the source lines 164 extend from the scanning signal driver circuit 605 and the image signal driver circuit 606, respectively, to the pixel portion 604, to be connected to the pixel TFTs 204. Furthermore, a flexible printed circuit board (PCB) 613 is connected to external input terminals 602 for inputting image signals or the like. The FPC 613 is firmly adhered by means of a reinforcement resin 614, and connected to the respective driver circuits via connecting wirings 603. In addition, the counter substrate 401 is further provided with a light shielding film and a transparent electrode, although these components are not illustrated.

The liquid crystal display device having the structure as set forth above can be formed by employing the active matrix substrates as described in Embodiments 1 to 3. By employing the active matrix substrate as described in Embodiment 1, the reflection-type liquid crystal display device can be obtained, while the transparent-type liquid crystal display device can be obtained by employing the active matrix substrate as described in Embodiment 3.

Embodiment 6

Figure 18A:
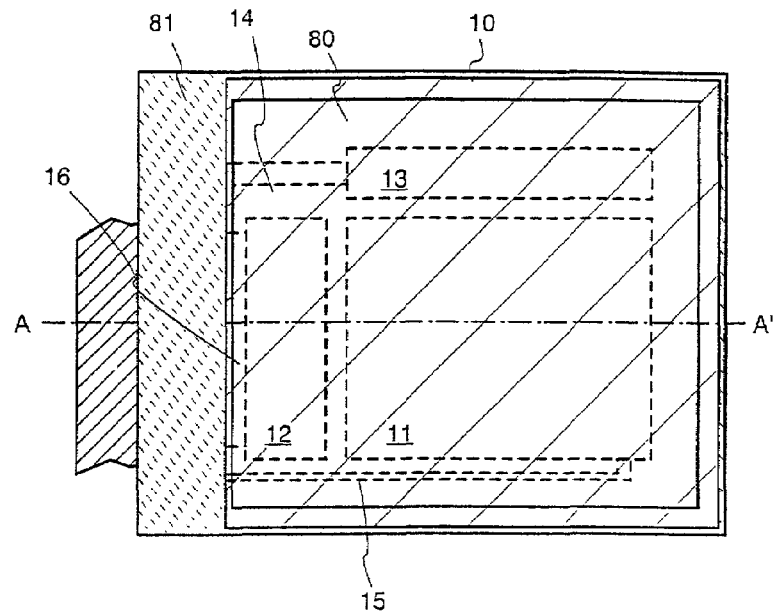
FIGS. 18A and 18B respectively show structures of an active matrix EL display device.

In this embodiment, the case will be described where a self-emission type EL display device also called a light emitting device or a light emitting diode (hereinafter described as EL display device) using the electro luminescence (EL) material is formed using an active matrix substrate according to the Embodiment 1. FIG. 18A is a top view of an EL display panel using the present invention. In FIG. 18A, reference numeral 10 denotes a substrate, 11 denotes a pixel portion, 12 denotes a source-side driver circuit, and 13 denotes a gate-side driver circuit. Each driver circuit is connected to an FPC 17 through wirings 14 to 16 so as to be connected to external equipment.

Figure 18B:
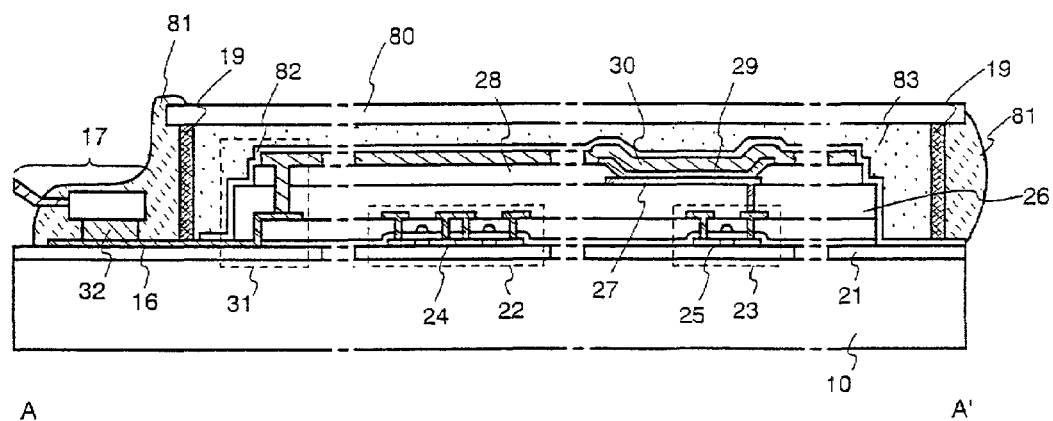

The FIG. 18B shows a cross sectional structure of A–A' of FIG. 18A. The counter material 80 is provided at least surface of the pixel portion, preferably the driver circuits and the surface of the pixel portion. The counter substrate 80 is attached to the active matrix substrate, on which TFTs and EL layer are formed, with a sealant 19. The sealant 19 is mixed with filler (not shown in the figure), two substrates are attached together with a filler at equal spaces. Further, the outside of the sealant 19 and the top surface of FPC 17, the periphery portion thereof has a structure of being filled up by the sealant 81. As materials of sealant 81, silicone resin, epoxy resin, phenol resin and butyl rubber are used.

As it is, the active matrix substrate 10 and the counter substrate 80 are attached together with sealant 19, a space is generated therebetween. The filler 83 is filled with the space. The filler 83 has an effect of attachment of the counter substrate 80. The PVC (polyvinyl chloride), epoxy resin, silicone resin, PVB (polyvinyl butyral), and EVA (ethylene vinyl acetate) can be used as the filler 83. An EL element is weak to moisture such as water and is likely to be degraded, so that is effective to mix a drying agent such as barium oxide in the filler 83 so as to enhance resistance to moisture. Further, a passivation film 82 is formed by the silicon nitride film and silicon oxynitride film to protect from erosion by alkali element which contains in filler 83.

A glass plate, an aluminum plate, a stainless steel plate, an FRP (fiberglass-reinforced plastic) plate, a PVF (polyvinyl fluoride) film, a Mylar film (a product of Dupon Corp.), a polyester film, and an acrylic film or acrylic plate can be used as the counter substrate 80. A sheet which structure is put several ten μm thick aluminum alloy between PVF film and Mylar film. In this manner, the EL element is completely sealed and is not exposed to the outside of air.

In FIG. 18B, the driving TFT 22 (CMOS circuit which is composed of n-channel type TFT and p-channel type TFT is shown here), and the pixel TFT 23 (only TFT controlling current to an EL element is shown here) are formed on a base film 21 over a substrate 10. Among these TFTs, in particular, n-channel TFT is provided with an LDD region having the structure shown in the present embodiment so as to prevent the decrease of the on current due to hot carrier, or the deterioration of the properties caused by Vth shift and bias stress.

For example, as the driver circuit TFT 22 for a driver circuit, the p-channel TFT 200, 202 or the n-channel TFT 201, 203 shown in FIG. 6B can be used. Furthermore, as the TFT 23 for a pixel portion, the pixel TFT 204 shown in FIG. 6B or a p-channel TFT having a similar structure can be used.

Figure 7B:
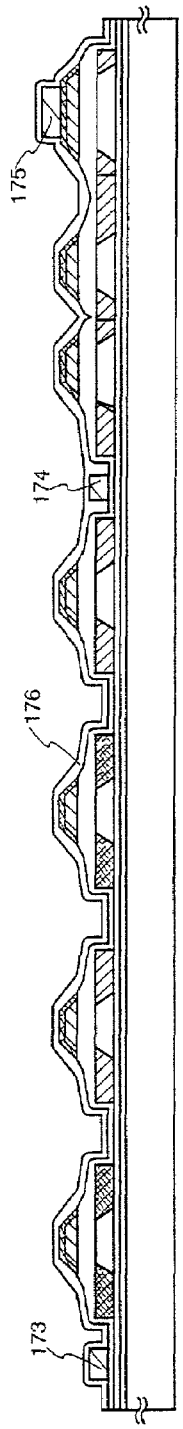

To manufacture the EL display device from an active matrix substrate state of FIG. 6B or 7B, an interlayer insulating film (a leveling film) 26 made of resin material, is formed on the source line and the drain line, and a pixel electrode 27 made of transparent conductive film, which is connected electrically to drain of pixel portion TFT 23, is formed thereon. As a transparent conductive film, a compound of indium oxide and tin oxide (referred to as ITO), and a compound of indium oxide and zinc oxide can be used.

Then after forming the pixel electrode 27, an insulating film 28 is formed, and an opening is formed on the pixel electrode 27.

Next, an EL layer 29 is formed. The EL layer 29 can have a layered structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and ink jet method can be used.

In this embodiment, the EL layer is formed by vapor deposition, ink jet method or dispenser method using a shadow mask. By forming light-emitting layers (red light-emitting layer, green-light emitting layer and blue light-emitting layer) capable of emitting light with different wavelengths on the pixel basis, a color display can be performed. In addition, a combination of a color conversion layer (CCM) and a color filter, or a combination of a white light-emitting layer and a color filter may be used. Needless to say, an EL display device emitting single color light can also be used.

When the EL layer 29 is formed, a cathode 30 is formed thereon. It is desirable to remove moisture and oxygen present at an interface between the cathode 30 and the EL layer 29 as much as possible. Thus, it is required to continuously form the EL layer 29 and the cathode 30 in a vacuum, or to form the EL layer 29 in an inactive atmosphere, and form the cathode 30 without exposing the EL layer 29 to the outside air. In this embodiment, for this purpose, a film formation device of a multi-chamber system (cluster tool system) is used.

In this embodiment, as the cathode 30, a layered structure of a LiF (lithium fluoride) film and an Al (aluminum) film is used. More specifically, the LiF film is formed to a thickness of 1 nm on the EL layer 29 by vapor deposition, and an Al film is formed to a thickness of 300 nm thereon. It is appreciated that a MgAg electrode that is a known cathode material may be used. The cathode 30 is connected to the wiring 16 in a region denoted by reference numeral 31. The wiring 16 is a power supply line for supplying a predetermined voltage to the cathode 30, and is connected to the FPC 17 via a conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening before forming the EL layer). Furthermore, when the insulating film 28 is etched, the interlayer insulating film 26 may also be etched together. In this case, if the interlayer insulating film 26 and the insulating film 28 are made of the same resin material, the shape of the contact holes can be made satisfactory.

Furthermore, the wiring 16 is electrically connected to the FPC 17 through a gap between the sealant 19 and the substrate 10 (the gap is filled with an sealant 81). Herein, although description is made with respect to the wiring 16, the other wirings 14 and 15 are also electrically connected to the FPC 17 through a gap between the sealant 18.

Figures 19A, 19B:
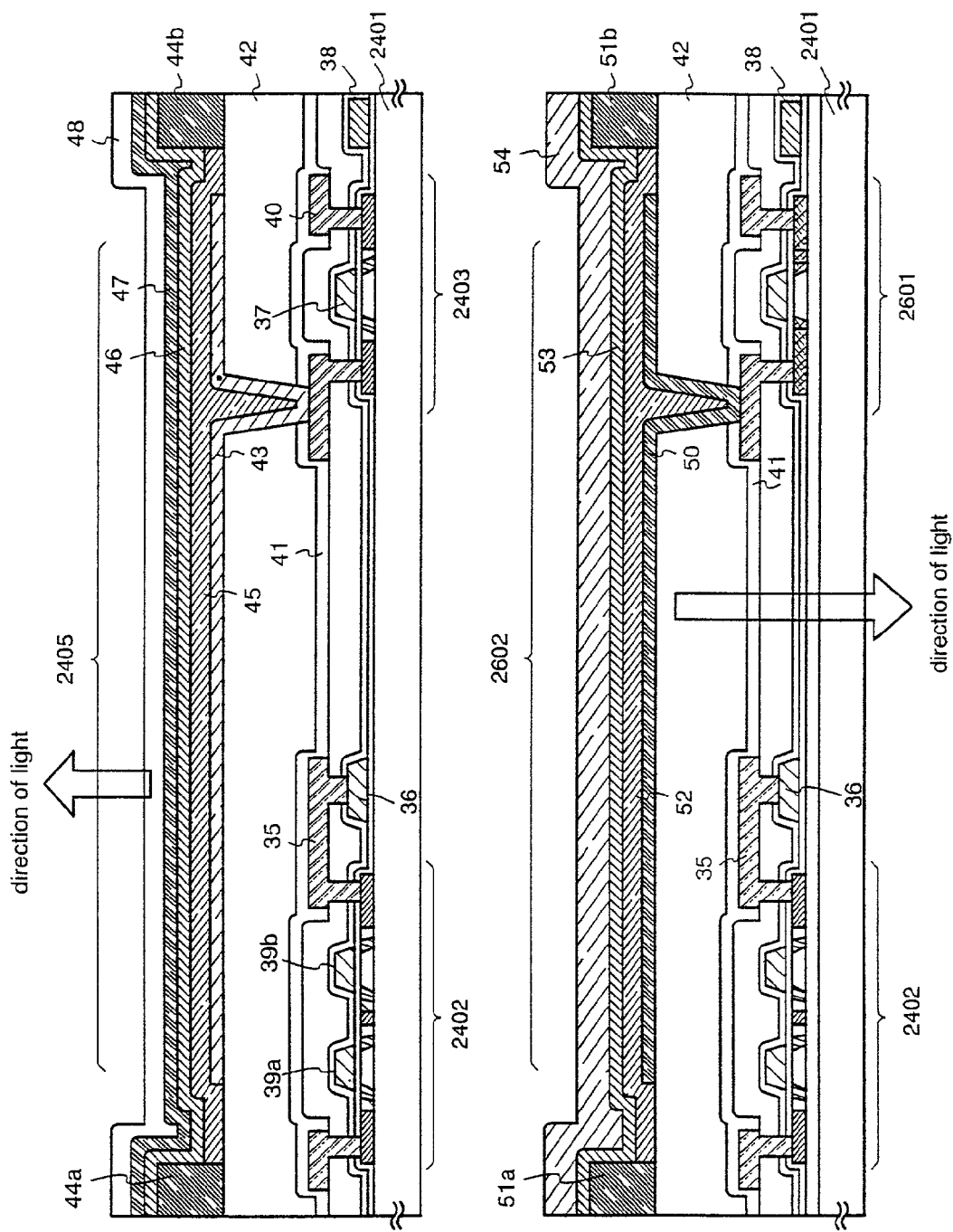
FIGS. 19A and 19B respectively show cross-sectional structures of an active matrix EL display device.

FIG. 19 shows a more detailed cross-sectional structure of the pixel portion. In FIG. 19A, a switching TFT 2402 provided on a substrate 2401 is formed according to the same structure of the pixel TFT 204 shown in FIG. 6 of Embodiment 1. Due to the double-gate structure, there is an advantage in that substantially two TFTs are connected in series to reduce an OFF current value. In this embodiment, the TFT 2402 has a double-gate structure; however, it may have a single gate structure, a triple gate structure, or a multi-gate structure having more gates.

A current controlling TFT 2403 is formed by using the n-channel TFT 201 shown in FIG. 6B. A drain wiring 35 of the switching TFT 2402 is electrically connected to a gate electrode 37 of the current controlling TFT by the wiring 36. Furthermore, a line 38 is a gate wiring electrically connected to gate electrodes 39a and 39b of the switching TFT 2402.

At this time, it is very important that the current controlling TFT 2403 has a structure of the present invention. The current controlling TFT functions for controlling the amount of a current flowing through an EL element, so that the current controlling TFT 2403 is likely to be degraded by heat and hot carriers due to a large amount of current flown therethrough. Therefore, the LDD region whose portion is overlapped with the gate electrode is provided in the current controlling TFT to prevent the deterioration of TFT and to increase the stability of operation.

Furthermore, in this embodiment, the current controlling TFT 2403 has a single gate structure. However, it may have a multi-gate structure in which a plurality of TFTs is connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

A first passivation film 41 is provided on the switching TFT 2402 and the current controlling TFT 2403, and a leveling film 42 that is made of a resin insulating film is formed thereon. It is very important to flatten the step difference due to TFTs by using the leveling film 42. The step difference may cause a light-emitting defect because the EL layer to be formed later is very thin. Thus, it is desirable to flatten the step difference so that the EL layer is formed on a flat surface before forming a pixel electrode.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a layered structure thereof can be preferably used. Needless to say, a layered structure with other conductive films may also be used. A light-emitting layer 44 is formed in a groove (corresponding to a pixel) formed by banks 44a and 44b made of an insulating film (preferably resin). Herein, only one pixel is shown; however, light-emitting layers corresponding to each color R (red), G (green), and B (blue) may be formed. As an organic EL material for the light-emitting layer, a π-conjugate polymer material is used. Examples of the polymer material include polyparaphenylene vinylene (PPV), polyvinyl carbazole (PVK), and polyfluorene. There are various types of PPV organic EL materials. For example, materials as described in "H. Shenk, H. Becker, O. Gelsen, E. Kluge, W. Kreuder and H. Spreitzer, "Polymers for Light Emitting Diodes", Euro Display, Proceedings, 1999, pp. 33–37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm). The above-mentioned organic EL materials are merely examples for use as a light-emitting layer. The present invention is not limited thereto. A light-emitting layer, an electric charge transporting layer, or an electric charge injection layer may be appropriately combined to form an EL layer (for light emitting and moving carriers therefore). For example, in this embodiment, the case where a polymer material is used for the light-emitting layer has been described. However, a low molecular-weight organic EL material may be used. Furthermore, an inorganic material such as silicon carbide can also be used for an electric charge transporting layer and an electric charge injection layer. As these organic EL materials and inorganic materials, known materials can be used.

In this embodiment, an EL layer with a layered structure is used, in which a hole injection layer 46 made of PEDOT (polythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward TFTs), so that the anode must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

When the anode 47 is formed, the EL element 2405 is completed. The EL element 2405 refers to a capacitor composed of the pixel electrode (cathode) 43, the light-emitting layer 45 and the capacitor formed by the hole injection layer 46 and the anode 47.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a switching TFT having a sufficiently low OFF current value and a current controlling TFT that is strong to the injection of hot carriers. Thus, an EL display panel is obtained, which has high reliability and is capable of displaying a satisfactory image.

In this embodiment, referring to FIG. 19B, the case will be described where the structure of the EL layer is reversed. The current control TFT 2601 is formed using a p-channel type TFT 200 of FIG. 6B. The manufacturing process is referred to Embodiment 1. In this embodiment, a transparent conductive film is used as a pixel electrode (anode) 50. Specifically, a conductive film is used which is compounded of indium oxide and zinc oxide. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

This embodiment can be realized by being appropriately combined with the structures of TFT in Embodiments 1 to 2.

Embodiment 7

The CMOS circuit and the pixel portion formed by implementing the present invention can be used in various electro-optical devices (active matrix type liquid crystal display device, active matrix type EL display device, and active matrix type EC display). That is, the present invention can be implemented in all electronic equipment that incorporate these electro-optical devices as a display portion.

The following can be given as such electronic equipment: a video camera, a digital camera, a projector (a rear type or a front type), a head mount display (goggle type display), a car navigation system, a car stereo, a personal computer, a portable information terminal (such as a mobile computer, a cellular phone, and an electronic book) etc. Some examples of these are shown in FIG. 20, FIG. 21 and FIG. 22.

Figures 20A, 20B:
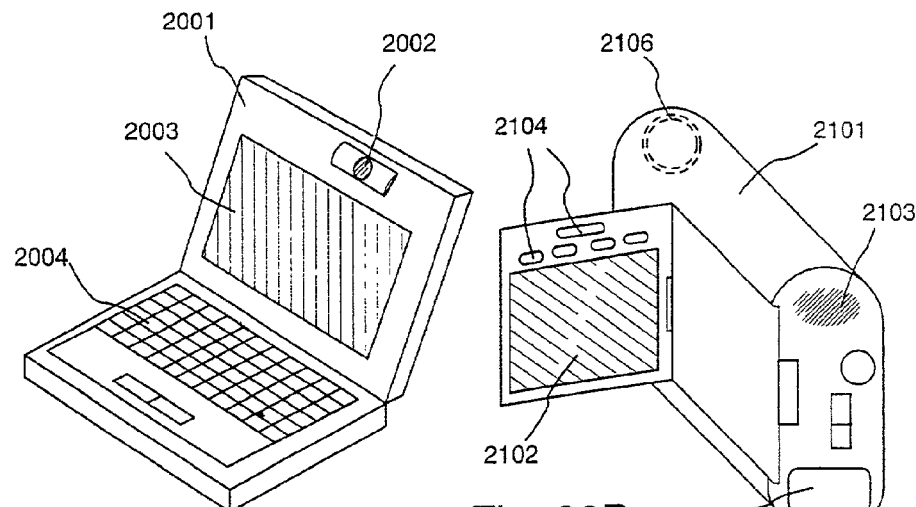
FIGS. 20A through 20F respectively show various electronic apparatuses.

FIG. 20A shows a personal computer that is comprised of a main body 2001, an image input portion 2002, a display portion 2003, and a keyboard 2004. The present invention can be applied to the display portion 2003, the image input portion 2002 and the other driving circuit.

FIG. 20B shows a video camera that is comprised of a main body 2101, a display portion 2102, an audio input portion 2103, operation switches 2104, a battery 2105, and an image receiving portion 2106. The present invention can be applied to the display portion 2102, and other driving circuit.

Figures 20C, 20D:
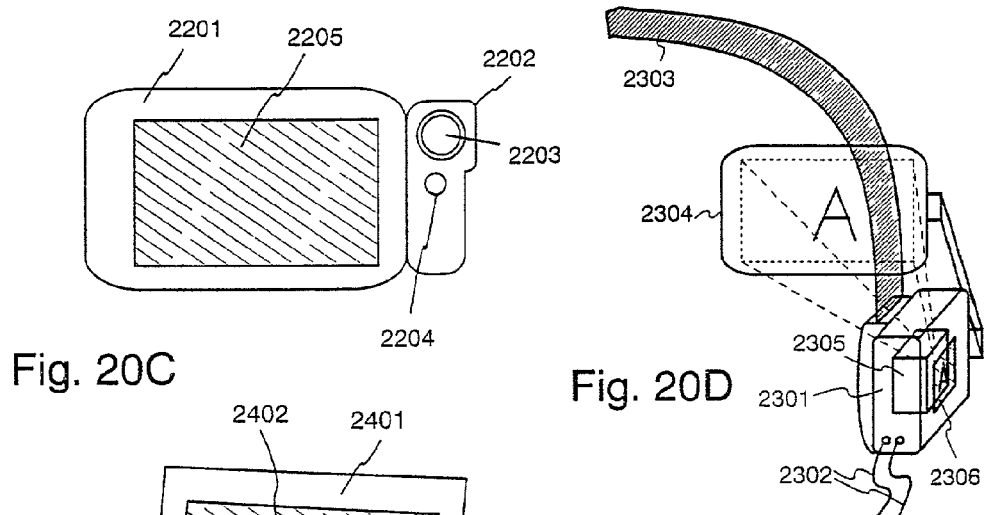

FIG. 20C shows a mobile computer that is composed of a main body 2201, a camera portion 2202, an image receiving portion 2203, operation switches 2204, and a display portion 2205. The present invention can be applied to the display portion 2205 and other driving circuit.

FIG. 20D shows a part of a head mounted type EL display (right side), that is composed of a main body 2301, signal cable 2302, head fixation band 2303, display portion 2304, optical system 2305, and display device 2306. The present invention can be used as the display device 2306.

Figures 20E, 20F:
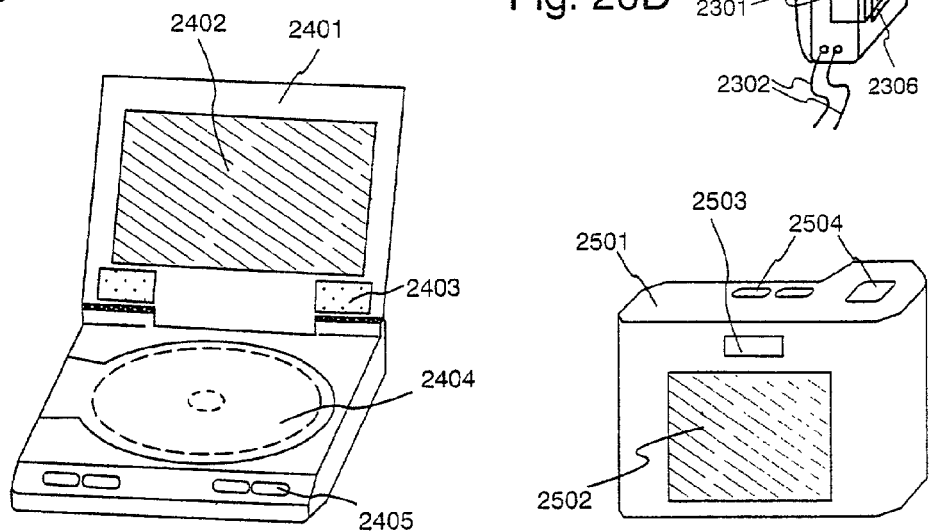

FIG. 20E shows a player which uses a recording medium in which a program is stored (hereinafter referred to as a recording medium) and which is comprised of a main body 2401, a display portion 2402, speaker portions 2403, a recording medium 2404, and operation switches 2405. A DVD (Digital Versatile Disc), a CD or the like is used as the recording medium to enable the player to appreciate music and the movies, and play a game or the Internet. The present invention can be applied to the display portion 2402 and other driving circuit.

FIG. 20F shows a digital camera that is comprised of a main body 2501, a display portion 2502, an eye-piece portion 2503, operation switches 2504, and an image receiving portion (not shown in the figure). The present invention can be applied to the display portion 2502 and other driving circuit.

FIG. 21A shows a front type projector that is comprised of a projection unit 2601, a screen 2602, and the like. The present invention can be applied to a liquid crystal display device 2808 which is a part structuring the projection unit 2601 and other driving circuit.

FIG. 21B shows a rear type projector that is comprised of a main body 2701, a projection unit 2702, a mirror 2703, a screen 2704, and the like. The present invention can be applied to the liquid crystal display device 2808 which is a part structuring the projection unit 2702 and other driving circuit.

Illustrated in FIG. 21C is an example of the structure of the projection units 2601 and 2702 that are shown in FIGS. 21A and 21B, respectively. Each of the projection units 2601 and 2702 is comprised of a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 is constructed of an optical system including projection lenses. An example of a three plate system is shown in the present embodiment, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 21C.

In addition, FIG. 21D shows an example of the structure of the light source optical system 2801 of FIG. 21C. In the present embodiment, the light source optical system 2801 is composed of a reflector 2811, a light source 2812, a lens array 2813 and 2814, a polarizing conversion element 2815, and a condenser lens 2816. Note that the light source optical system shown in FIG. 21D is an example, and it is not limited to the illustrated structure. For example, the operator may suitably set optical systems such as optical lenses, polarizing film, film to regulate the phase difference, and IR film.

The projector illustrated in FIG. 21, show the electro optical device of transparent type but the example of the electro optical device of reflection type and the EL display device.

Figure 22A:
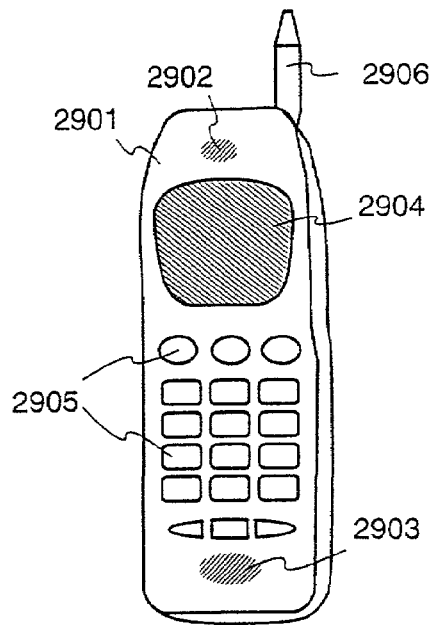
FIGS. 22A through 22C respectively show various electronic apparatuses.

FIG. 22A shows a cellular phone that is comprised of a main body 2901, an audio output portion 2902, an audio input portion 2903, a display portion 2904, an operation switches 2905 and an antenna 2906 etc. The present invention can be applied to the audio output portion 2902, the audio input portion 2903, the display portion 2904 and other driver circuit.

Figure 22B:
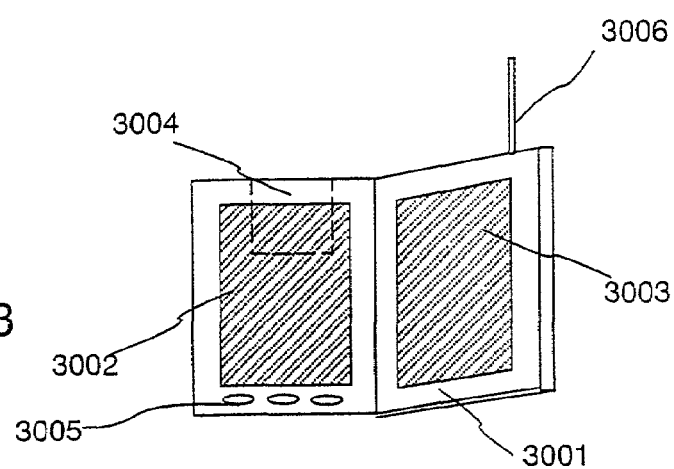

FIG. 22B shows a mobile book (electronic book) that is comprised of a main body 3001, a display portion 3002, 3003, a recording medium 3004, an operation switches 3005 and a antenna 3006 etc. The present invention can be applied to the display portion 3002, 3003 and other driver circuit.

Figure 22C:
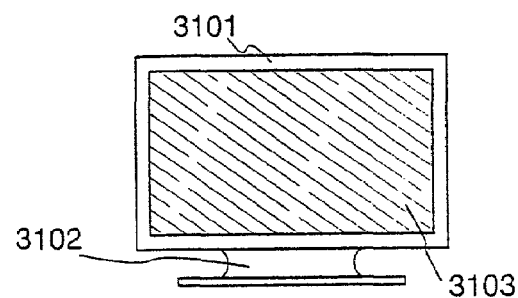

FIG. 22C shows a display that is comprised of a main body 3101, a support stand 3102 and display portion 3103 etc. The present invention can be applied to the display portion 3103. They are especially advantageous for cases in which the screen is made large, and is favorable for displays having a diagonal greater than or equal to 10 inches (especially one which is greater than or equal to 30 inches).

Thus, the application range for the present invention is extremely wide, and it may be applied to electronic equipment in all fields. Further, the electronic equipment of this Embodiment can be realized with a composition that uses any combination of Embodiments 1 to 6.

Embodiment 8

In the present embodiment, a TFT fabricated by setting the dosage such that the boron concentration in the channel forming region becomes at $1.6 \times 10^{17}/cm^3$ and by employing the 0.1% hydrogen diluted gas for the channel doping is compared with a TFT fabricated by employing the 5% hydrogen diluted gas for the channel doping. All the processes except for the channel doping are identical with those in Embodiment 1.

Figure 30:
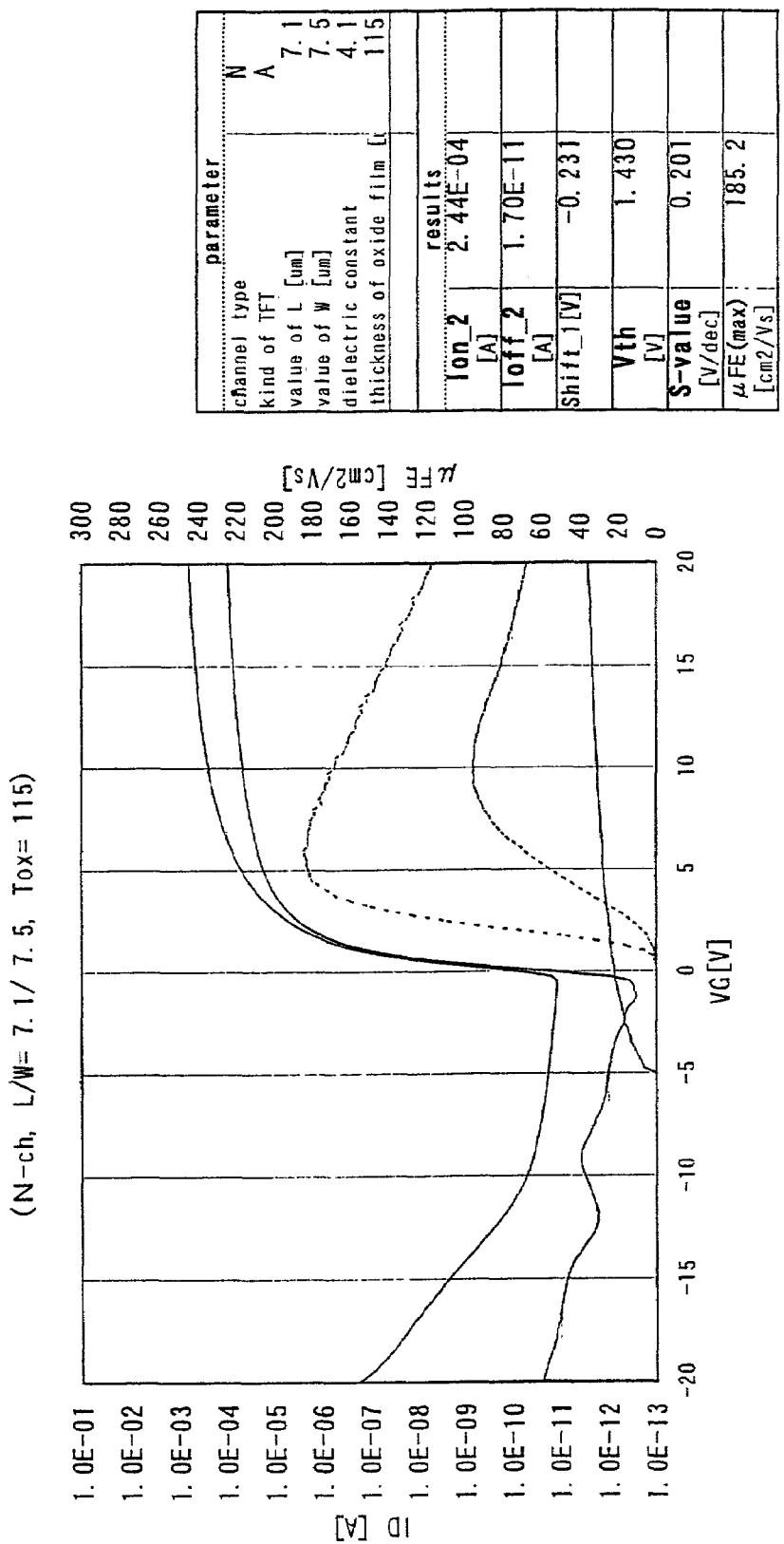
FIG. 30 is a diagram indicating voltage/current characteristics of a TFT fabricated by employing the channel doping with the 5% hydrogen diluted B.

FIG. 30 shows the voltage/current characteristics (also referred to as the I-V curve) of the TFT provided by employing the 5% hydrogen diluted gas for the channel doping. A threshold value (Vth) of the TFT is 1.43 V, an S value is 0.201 V/dec, a field effect mobility (μFE) is 185.2 $cm^2/Vs$, an ON current value is $2.44 \times 10^{-4}$ A with Vds (a voltage difference between the source region and the drain region)=5 V, an OFF current value is $1.7 \times 10^{-11}$ A with Vds=5 V, and a Shift-1 is −0.231 V. The S value means the threshold value and indicates an inverse of the maximum slope at the rising position of the I-V curve. The Shift-1 indicates a voltage value at the rising position of the I–V curve.

Figure 31:
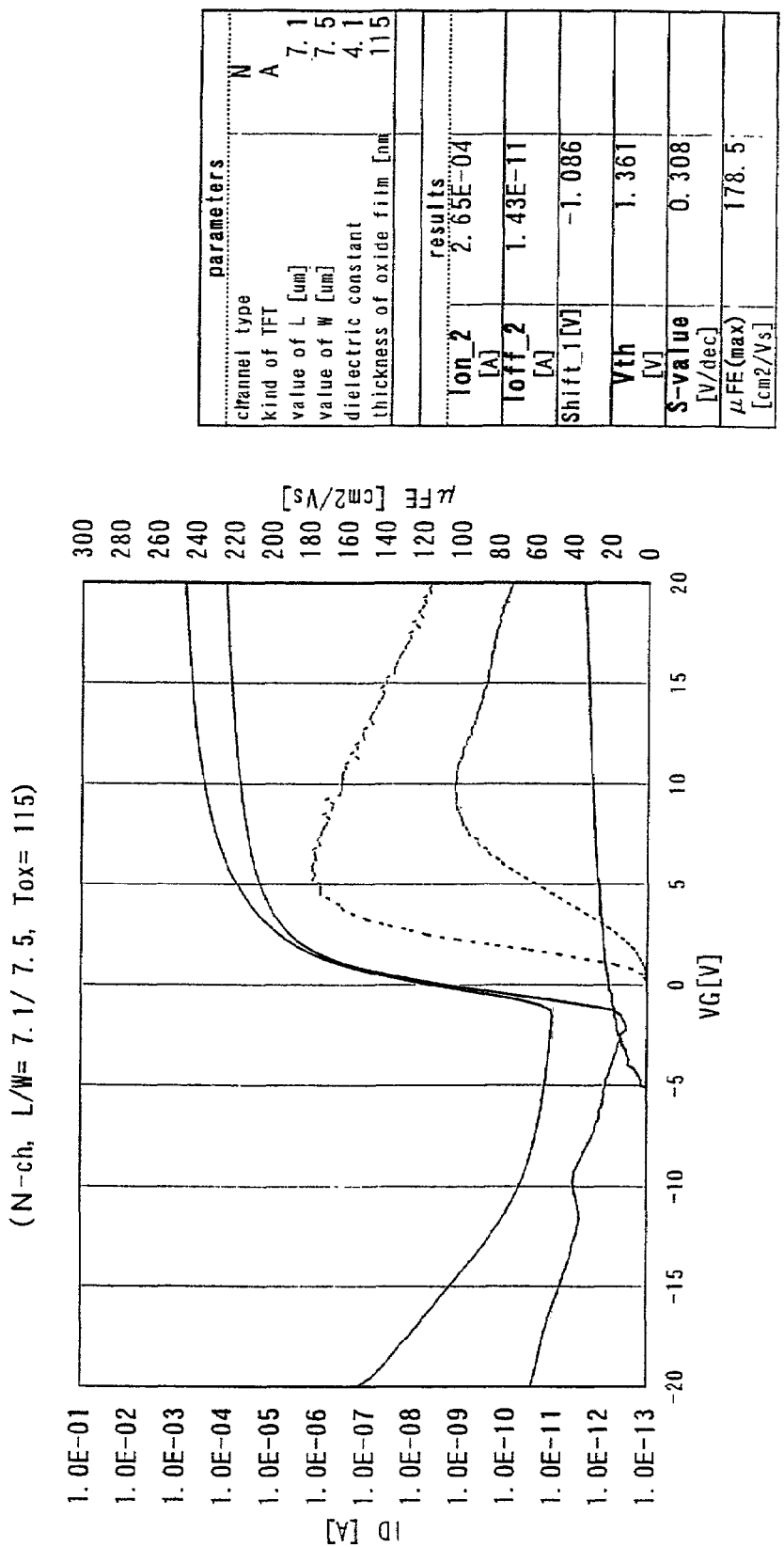
FIG. 31 is a diagram indicating voltage/current characteristics of a TFT fabricated by employing the channel doping with the 0.1% hydrogen diluted B.

On the other hand, FIG. 31 shows the voltage/current characteristics of the TFT provided by employing the 0.1% hydrogen diluted gas for the channel doping. A threshold value (Vth) of the TFT is 1.361 V, an S value is 0.308 V/dec, a field effect mobility (μFE) is 178.5 $cm^2/Vs$, an ON current value is $2.65 \times 10^{-4}$ A with Vds (a voltage difference between the source region and the drain region)=5 V, an OFF current value is $1.43 \times 10^{-11}$ A with Vds=5 V, and a Shift-1 is −1.086 V.

From the experimental results as shown in FIGS. 30 and 31, with the 5% hydrogen diluted gas, more satisfactory TFT characteristics are obtained, and especially, the S value is suppressed to a small level. In addition, the Shift-1 value is closer to 0 in the case with the 5% hydrogen diluted gas. The reason why the 0.1% hydrogen diluted gas provides poorer TFT characteristics can be considered that an introduced amount of the ambient atmospheric components to be simultaneously added during the doping process, or hydrogens, is increased, thereby resulting in more damages (injection defects or the like) being applied to the semiconductor material.

In addition, by increasing a ratio of the dopant (B) amount in the doping gas during the channel doping of borons, an introduced amount of the ambient atmospheric components (C, N, O) to be simultaneously added, during the doping process, or hydrogens, can be decreased, thereby resulting in a semiconductor device including TFTs capable of exhibiting stable and satisfactory TFT characteristics being realized.

As set forth above, in accordance with the present invention, a minute amount ($1 \times 10^{15}$ to $1 \times 10^{17}$ atoms/$cm^3$) of impurity elements (typically, borons) can be doped while suppressing the concentrations of ambient atmospheric components (C, N, O) to be added, or hydrogens. Thus, a desired threshold value can be obtained. In addition, the present invention employs an ion doping apparatus, and therefore the doping can be performed in a short period of time, thereby resulting in a high throughput.

What is claimed is:

1. A method of manufacturing a semiconductor device comprising the step of:
   forming a semiconductor film having an amorphous structure over a substrate;
   crystallizing the semiconductor film;
   forming an insulating film over the semiconductor film; and
   ion-doping an impurity element into a channel region of the semiconductor film,
   wherein said impurity element imparts n-type conductivity or p-type conductivity to said semiconductor film,
   wherein a concentration of carbon is at $3\times10^{17}$ atoms/cm$^3$ or less in said semiconductor film after the step,
   wherein no mass separation is performed in the ion-doping step, and
   wherein said impurity element is doped into the semiconductor film by employing a source material gas comprising said impurity element diluted with hydrogen at a concentration in the range of 0.5% to 5%.

2. A method of manufacturing a semiconductor device comprising the step of:
   forming a semiconductor film having an amorphous structure over a substrate;
   crystallizing the semiconductor film;
   forming an insulating film over the semiconductor film;
   ion-doping an impurity element into a channel region of the semiconductor film,
   wherein said impurity element imparts n-type conductivity or p-type conductivity to said semiconductor film,
   wherein a concentration of nitrogen is at $1\times10^{17}$ atoms/cm$^3$ or less in said semiconductor film after the step,
   wherein no mass separation is performed in the ion-doping step, and
   wherein said impurity element is doped into the semiconductor film by employing a source material gas comprising said impurity element diluted with hydrogen at a concentration in the range of 0.5% to 5%.

3. A method of manufacturing a semiconductor device comprising the step of:
   forming a semiconductor film having an amorphous structure over a substrate;
   crystallizing the semiconductor film;
   forming an insulating film over the semiconductor film; and
   ion-doping an impurity element into a channel region of the semiconductor film,
   wherein said impurity element imparts n-type conductivity or p-type conductivity to said semiconductor film,
   wherein a concentration of oxygen is at $3\times10^{17}$ atoms/cm$^3$ or less in said semiconductor film after the step,
   wherein no mass separation is performed in the ion-doping step, and
   wherein said impurity element is doped into the semiconductor film by employing a source material gas comprising said impurity element diluted with hydrogen at a concentration in the range of 0.5% to 5%.

4. A method of manufacturing a semiconductor device according to claim 1, wherein said semiconductor film is used as at least a channel forming region of a TFT.

5. A method of manufacturing a semiconductor device according to claim 1, wherein said impurity element imparting p-type conductivity comprises a gas containing diborane, BF$_2$, or boron.

6. A method of manufacturing a semiconductor device according to claim 1, wherein said impurity element imparting n-type conductivity comprises either one of a gas containing P or As, and phosphine.

7. A method for fabricating a semiconductor device according to claim 1, wherein the impurity element imparting p-type conductivity is doped into the semiconductor film by employing a source material gas that contains diborane diluted with hydrogen to the concentration in the range from 0.5% to 5%.

8. A method of manufacturing a semiconductor device according to any one of claims 1 to 3, wherein the impurity element imparting p-type conductivity is doped into the semiconductor film by employing a source material gas that contains diborane diluted with hydrogen to the concentration in the range from 0.5% to 1%.

9. A method of manufacturing a semiconductor device according to claim 1, wherein the semiconductor device is one selected from the group consisting of a personal computer, a video camera, a portable information terminal, a digital camera, a digital video disk player, an electronic amusement apparatus, and a projector.

10. A method according to claim 1, wherein the concentration of hydrogen to be ion-doped simultaneously with said impurity element in said semiconductor film is set to be at $1\times10^{19}$ atoms/cm$^3$ or less.

11. A method of manufacturing a semiconductor device comprising the step of:
    forming a semiconductor film having an amorphous structure over a substrate;
    crystallizing the semiconductor film;
    forming an insulating film over the semiconductor film;
    ion-doping an impurity element into a channel region of the semiconductor film,
    wherein said impurity element imparts n-type conductivity or p-type conductivity to said semiconductor film,
    wherein a concentration of hydrogen is at $1\times10^{19}$ atoms/cm$^3$ or less in said semiconductor film after the step,
    wherein no mass separation is performed in the ion-doping step, and
    wherein said impurity element is doped into the semiconductor film by employing a source material gas comprising said impurity element diluted with hydrogen at a concentration in the range of 0.5% to 5%.

12. A method of manufacturing a semiconductor device comprising the step of:
    forming a semiconductor film having an amorphous structure over a substrate;
    crystallizing the semiconductor film;
    forming an insulating film over the semiconductor film;
    ion-doping an impurity element into a channel region of the semiconductor film through the insulating film,
    wherein said impurity element imparts n-type conductivity or p-type conductivity to said semiconductor film,
    wherein said impurity element is doped into said semiconductor film by using a source material gas containing said impurity element diluted with hydrogen to the concentration in the range from 0.5% to 5%, and
    wherein no mass separation is performed in the ion-doping step.

13. A method of manufacturing a semiconductor device according to claim 2, wherein said semiconductor film is used as at least a channel forming region of TFT.

14. A method of manufacturing a semiconductor device according to claim 3, wherein said semiconductor film is used as at least a channel forming region of TFT.

15. A method of manufacturing a semiconductor device according to claim 11, wherein said semiconductor film is used as at least a channel forming region of TFT.

16. A method of manufacturing a semiconductor device according to claim 12, wherein said semiconductor film is used as at least a channel forming region of TFT.

17. A method of manufacturing a semiconductor device according to claim 2, wherein said impurity element imparting p-type conductivity comprises a gas containing diborane, $BF_2$, or boron.

18. A method of manufacturing a semiconductor device according to claim 3, wherein said impurity element imparting p-type conductivity comprises a gas containing diborane, $BF_2$, or boron.

19. A method of manufacturing a semiconductor device according to claim 11, wherein said impurity element imparting p-type conductivity comprises a gas containing diborane, $BF_2$, or boron.

20. A method of manufacturing a semiconductor device according to claim 12, wherein said impurity element imparting p-type conductivity comprises a gas containing diborane, $BF_2$, or boron.

21. A method of manufacturing a semiconductor device according to claim 2, wherein said impurity element imparting n-type conductivity comprises either one of a gas containing P or As, and phosphine.

22. A method of manufacturing a semiconductor device according to claim 3, wherein said impurity element imparting n-type conductivity comprises either one of a gas containing P or As, and phosphine.

23. A method of manufacturing a semiconductor device according to claim 11, wherein said impurity element imparting n-type conductivity comprises either one of a gas containing P or As, and phosphine.

24. A method of manufacturing a semiconductor device according to claim 12, wherein said impurity element imparting n-type conductivity comprises either one of a gas containing P or As, and phosphine.

25. A method for fabricating a semiconductor device according to claim 2, wherein the impurity element imparting p-type conductivity is doped into the semiconductor film by employing a source material gas that contains diborane diluted with hydrogen to the concentration in the range from 0.5 to 5%.

26. A method for fabricating a semiconductor device according to claim 3, wherein the impurity element imparting p-type conductivity is doped into the semiconductor film by employing a source material gas that contains diborane diluted with hydrogen to the concentration in the range from 0.5 to 5%.

27. A method for fabricating a semiconductor device according to claim 11, wherein the impurity element imparting p-type conductivity is doped into the semiconductor film by employing a source material gas that contains diborane diluted with hydrogen to the concentration in the range from 0.5 to 5%.

28. A method of manufacturing a semiconductor device according to claim 2, wherein said impurity element imparting p-type conductivity is doped into the semiconductor film by employing a source material gas that contains diborane diluted with hydrogen to the concentration in the range from 0.5 to 1%.

29. A method of manufacturing a semiconductor device according to claim 3, wherein said impurity element imparting p-type conductivity is doped into the semiconductor film by employing a source material gas that contains diborane diluted with hydrogen to the concentration in the range from 0.5 to 1%.

30. A method of manufacturing a semiconductor device according to claim 11, wherein said impurity element imparting p-type conductivity is doped into the semiconductor film by employing a source material gas that contains diborane diluted with hydrogen to the concentration in the range from 0.5 to 1%.

31. A method of manufacturing a semiconductor device according to claim 2, wherein the semiconductor device is one selected form the group consisting of a personal computer, a video camera, a portable information terminal, a digital camera, a digital video disk player, an electronic amusement apparatus, and a projector.

32. A method of manufacturing a semiconductor device according to claim 3, wherein the semiconductor device is one selected form the group consisting of a personal computer, a video camera, a portable information terminal, a digital camera, a digital video disk player, an electronic amusement apparatus, and a projector.

33. A method of manufacturing a semiconductor device according to claim 11, wherein the semiconductor device is one selected form the group consisting of a personal computer, a video camera, a portable information terminal, a digital camera, a digital video disk player, an electronic amusement apparatus, and a projector.

34. A method of manufacturing a semiconductor device according to claim 12, wherein the semiconductor device is one selected form the group consisting of a personal computer, a video camera, a portable information terminal, a digital camera, a digital video disk player, an electronic amusement apparatus, and a projector.

35. A method according to claim 2, wherein the concentration of hydrogen to be ion-doped simultaneously with said impurity element in said semiconductor film is set to be at $1 \times 10^{19}$ atoms/cm$^3$ or less.

36. A method according to claim 3, wherein the concentration of hydrogen to be ion-doped simultaneously with said impurity element in said semiconductor film is set to be at $1 \times 10^{19}$ atoms/cm$^3$ or less.

37. A method according to claim 12, wherein the concentration of hydrogen to be ion-doped simultaneously with said impurity element in said semiconductor film is set to be at $1 \times 10^{19}$ atoms/cm$^3$ or less.

38. A method according to claim 1, wherein said ion-doping is performed through the insulating film.

39. A method according to claim 2, wherein said ion-doping is performed through the insulating film.

40. A method according to claim 3, wherein said ion-doping is performed through the insulating film.

41. A method according to claim 11, wherein said ion-doping is performed through the insulating film.

42. A method according to claim 12, wherein said ion-doping is performed through the insulating film.

* * * * *